United States Patent
Kurokawa

(10) Patent No.: US 12,244,347 B2
(45) Date of Patent: Mar. 4, 2025

(54) OPTICAL TRANSMISSION MODULE, OPTICAL DATA LINK, AND OPTICAL TRANSMISSION SYSTEM

(71) Applicant: 7GAA CO., LTD., Ibaraki (JP)

(72) Inventor: Satoru Kurokawa, Ibaraki (JP)

(73) Assignee: 7GAA CO., LTD., Ibaraki (JP)

(*) Notice: Subject to any disclaimer, the term of this patent is extended or adjusted under 35 U.S.C. 154(b) by 93 days.

(21) Appl. No.: 18/006,608

(22) PCT Filed: Aug. 20, 2021

(86) PCT No.: PCT/JP2021/030637
§ 371 (c)(1),
(2) Date: Jan. 24, 2023

(87) PCT Pub. No.: WO2022/045015
PCT Pub. Date: Mar. 3, 2022

(65) Prior Publication Data
US 2023/0268997 A1     Aug. 24, 2023

(30) Foreign Application Priority Data

Aug. 26, 2020   (JP) .................... 2020-142910

(51) Int. Cl.
*H04B 10/00*     (2013.01)
*H01P 5/18*      (2006.01)
(Continued)

(52) U.S. Cl.
CPC .......... *H04B 10/40* (2013.01); *H01P 5/184* (2013.01); *H01Q 9/045* (2013.01); *H04B 10/2589* (2020.05)

(58) Field of Classification Search
CPC .......... H04B 10/2507; H04B 10/532; H04B 10/548; H04B 10/516; H04B 10/564;
(Continued)

(56) References Cited

U.S. PATENT DOCUMENTS

| 10,998,979 | B1* | 5/2021 | Parker ..................... G02F 1/015 |
| 2007/0030865 | A1* | 2/2007 | Day ..................... H01S 5/02216 372/4 |
| 2013/0302037 | A1 | 11/2013 | Wernlund | |

FOREIGN PATENT DOCUMENTS

| JP | H098583 A | 1/1997 |
| JP | 2003046179 A | 2/2003 |
| JP | 2008-34460 A | 2/2008 |

OTHER PUBLICATIONS

International Search Report dated Nov. 21, 2021 for PCT Appl. No. PCT/JP2021/030637.
(Continued)

*Primary Examiner* — Hanh Phan
(74) *Attorney, Agent, or Firm* — Ohlandt, Greeley and Perle, L.L.P.

(57) ABSTRACT

An optical transmission module, an optical data link, and an optical transmission system achieving a simplified matching circuit and a bias circuit with higher power efficiency. An optical transmission module including a first line, one end of which is connected to a high-frequency signal input unit and the other end of which is connected to a termination unit; a second line, one end of which is connected to an electrical-optical conversion unit and the other end of which is connected to a power supply connection unit of a DC power supply; and a coupling portion at which the first line is electromagnetically coupled to the second line. In the second line, a signal input from the high-frequency signal input unit is propagated only to the electrical-optical conversion unit due to an attenuation relationship between coupling characteristics and isolation characteristics of the first line and the second line. Alternatively, provided is an optical transmission module including a matching resistor connected in parallel to an electrical-optical conversion unit, a first capacitor preventing a direct current from flowing from
(Continued)

a power supply connection unit of a DC power supply to the matching resistor, and a second capacitor connected in series between a high-frequency signal input unit and the matching resistor. Also provided are an optical data link and an optical transmission system.

19 Claims, 13 Drawing Sheets

(51) Int. Cl.
*H01Q 9/04* (2006.01)
*H04B 10/25* (2013.01)
*H04B 10/40* (2013.01)

(58) Field of Classification Search
CPC .......... H04B 10/2575; H04B 10/25752; H04B 10/25753; H04B 10/07953; H01P 5/184; H01Q 9/045

USPC ....... 398/135, 136, 137, 138, 139, 158, 159, 398/164, 182, 183, 186, 187, 188, 192, 398/193, 194, 115, 116, 117; 372/32, 34, 372/36, 38.02
See application file for complete search history.

(56) References Cited

OTHER PUBLICATIONS

Yansheng et al; "Research on VCSEL Optical Ouput Stabilization Driving Circuit System and LSI for GB/s Band Optical Interconnection"; Mar. 2008; 12 pgs.
HFDN-26.3; "MAX3735A Laser Driver Output Configurations, Part 4: Driving VCSELs"; Maxin Integrated; Apr. 2008; 8 pgs.
Kozlov et al; "Capacitively-Coupled CMOS VCSEL Driver Circuits"; IEEE Journal of Solid-State Circuits, vol. 51, No. 9; Sep. 9, 2016; 14 pgs.

* cited by examiner

PROPAGATION CHARACTERISTICS OF PORTS
(SPACE AT COUPLING PORTION: D = 1.2mm)

PROPAGATION CHARACTERISTICS OF PORTS
(SPACE AT COUPLING PORTION: D = 0.7mm)

PROPAGATION CHARACTERISTICS OF PORTS
(SPACE AT COUPLING PORTION: D = 0.17mm)

PROPAGATION CHARACTERISTICS OF PORTS
(SPACE AT COUPLING PORTION: D = 1.2mm)

PROPAGATION CHARACTERISTICS OF PORTS
(SPACE AT COUPLING PORTION: D = 0.7mm)

PROPAGATION CHARACTERISTICS OF PORTS
(SPACE AT COUPLING PORTION: D = 0.17mm)

FREQUENCY CHARACTERISTICS OF PORT3($T_1$ = 0.8mm. $T_2$ = 1.2mm)

FREQUENCY CHARACTERISTICS OF PORT4($T_1$ = 0.8mm. $T_2$ = 1.2mm)

DIRECTIONAL CHARACTERISTICS(W = 1.0mm. $T_1$ = 0.8mm)

OPTICAL TRANSMISSION MODULE, OPTICAL DATA LINK, AND OPTICAL TRANSMISSION SYSTEM

BACKGROUND

1. Field of the Disclosure

The present disclosure relates to an optical transmission module that transmits and receives an electrical signal through an optical transmission line, an optical data link including the optical transmission module, and an optical transmission system including the optical data link.

2. Discussion of the Background Art

In recent years, the sudden increase in internet traffic has led to higher demand for optical transmission systems capable of high-speed and large-capacity communication. An optical transmission system is composed of data transceivers, and an optical data link connected between the transceivers and including an optical cable and optical transmission modules connected to the respective ends of the optical cable. The optical transmission modules are constituted by an optical signal transmission-side module composed of an electrical-optical conversion unit such as a semiconductor laser that receives an electrical signal and converts the electrical signal into an optical signal, and a bias circuit that drives the electrical-optical conversion unit; and an optical signal reception-side module composed of an optical-electrical conversion unit such as a photodiode that receives the optical signal and converts the optical signal into an electrical signal, a signal extraction circuit, and the like.

FIG. 14 shows, as an example, an equivalent circuit 100 of a conventional optical transmission module (transmission-side) including a semiconductor laser. The equivalent circuit 100 includes at least a semiconductor laser 101, a bias circuit 102, and an impedance matching circuit 103 (see, for example, PTL 1 and NPL 1). The bias circuit 102 is connected to a DC drive power supply for applying a bias voltage to the semiconductor laser 101 to cause excitation oscillation of the semiconductor laser 101. The impedance matching circuit 103 matches the impedance of an AC signal input to the semiconductor laser 101 to that of the semiconductor laser 101.

In an optical transmission module including, for example, a vertical-cavity surface-emitting laser (VCSEL) as an electrical-optical conversion unit, a matching resistor is connected in parallel to the VCSEL in a bias circuit (e.g., PTL 2, NPL 2, and NPL 3).

FIGS. 15A and 15B respectively show, as examples, circuits 200 and 300 of a conventional optical transmission module including a bias circuit and a VCSEL. The portions surrounded by the dashed line indicate bias-T circuits 214 and 314. A capacitor 214B removes low-frequency components from a high-frequency signal input from an input terminal 210, and a capacitor 314B removes low-frequency components from a high-frequency signal input from an input terminal 310. On the other hand, when a DC voltage VDC is applied from a DC power supply 213, an inductor 214A removes high-frequency components from a DC component flowing through the bias-T circuit 214, and when a DC voltage VDC is applied from a DC power supply 313, an inductor 314A removes high-frequency components from a DC component flowing through the bias-T circuit 314. In FIG. 15B, an RLC series circuit is formed, and a matching resistor 314C is connected in the circuit. Then, the DC component is added to the high-frequency signal and supplied to a VCSEL 211 or a VCSEL 311. In this case, a matching resistor 212, or a matching resistor 312 and the matching resistor 314C are inserted to match the characteristic impedance of the circuit to that of the VCSEL 211 or the VCSEL 311.

(PTL 1) JP 2003-46179 A
(PTL 2]) JP H9-8583 A

Non Patent Literature (NPL 1) Yansheng Li, "Studies on Output Stabilized VCSEL Driver Architecture and LSI Implementation for Gb/s Optical Interconnection," [online], March 2008, Kagoshima University, [retrieved on Mar. 23, 2020], Internet <http://ir.kagoshima-u.ac.jp/bitstream/10232/4897/1/李.pdf>

(NPL 2) V. Kozlov and A. C. Carusone, "Capacitively-Coupled CMOS VCSEL Driver Circuits," IEEE Jour. Solid-State Circuits, vol. 51, no. 9, pp. 2077-2090, September 2016

(NPL 3) Maxim Integrated, MAX3735A Laser Driver Output Configurations, Part 4: Driving VCSELs, Design Note: HFDN-26.3, Rev. 1; 04/08 (2004)

SUMMARY

Technical Problem

Transmission lines used in high-frequency circuits at a few MHz or higher typically have a characteristic impedance of 50Ω (75Ω for transmission lines of TVs etc.). Due to the characteristic impedance of the transmission lines, conventional optical transmission modules have been required to include a matching circuit, as shown in the configuration of the equivalent circuit 100 in FIG. 14. Furthermore, at least an inductor needs to be inserted to supply a bias voltage. This requires a large number of components, and selection of a coil can be difficult depending on the frequency band used, and a large-sized coil may be necessary. The circuit may become complex, resulting in high cost. Furthermore, this goes against the recent trend toward smaller-sized optical transmission modules.

On the other hand, the VCSEL at a high frequency typically has an equivalent resistance of approximately 100Ω or more, but the matching resistor has a resistance of approximately 100Ω or less. Thus, a direct current flowing through the matching resistor is larger than a direct current flowing through the VCSEL, and most of the power consumption of the DC power supply is the power consumption of the matching resistor. This causes very low power efficiency of the entire circuit. Furthermore, if a matching resistor for a high power value is used to cover the power consumption required by the matching resistor, the matching resistor has a large physical size; thus, it is difficult to form such a matching resistor with a pattern. Accordingly, the matching resistor is mounted as a chip resistor in a wiring line; however, an optical transmission module including a chip resistor has poor high-frequency characteristics.

The present disclosure is to solve the above problems, and a first object of the present disclosure is to provide an optical transmission module, an optical data link, and an optical transmission system with a small size at low cost by simplifying a circuit constituting the optical transmission module.

A second object of the present disclosure is to provide an optical transmission module, an optical data link, and an optical transmission system enabling a bias circuit constituting the optical transmission module to have higher power efficiency and achieving better high-frequency characteristics.

Solution to Problem

In order to achieve the above objects, a first aspect of the present disclosure provides an optical transmission module including a first line, one end of which is connected to a high-frequency signal input unit and the other end of which is connected to a termination unit;
 a second line, one end of which is connected to an electrical-optical conversion unit that converts an electrical signal input from the high-frequency signal input unit into an optical signal and outputs the optical signal, the other end of which is connected to a power supply connection unit that is connected to a DC power supply and applies a voltage to drive the electrical-optical conversion unit; and
 a coupling portion at which the first line and the second line are electromagnetically coupled to each other via a predetermined space with a predetermined electrical length with respect to a wavelength of a frequency used,
wherein
 in a frequency band range in which an attenuation of coupling characteristics between the first line and the second line is lower than an attenuation of isolation characteristics between the first line and the second line,
 the electrical-optical conversion unit is connected to an end of the second line in the same direction as a propagation direction of a traveling wave of a high-frequency signal input from the high-frequency signal input unit to the first line, and the power supply connection unit is connected to the other end of the second line, and
 in a frequency band range in which the attenuation of the coupling characteristics between the first line and the second line is higher than the attenuation of the isolation characteristics between the first line and the second line,
 the electrical-optical conversion unit is connected to an end of the second line in a direction opposite to a propagation direction of a traveling wave of a high-frequency signal input from the high-frequency signal input unit to the first line, and the power supply connection unit is connected to the other end of the second line.

With this configuration, an optical transmission module can be configured such that a high-frequency signal is propagated only to an electrical-optical conversion unit, using an attenuation relationship between coupling characteristics and isolation characteristics varying depending on the frequency band used; thus, no inductor is required in an electrical-optical conversion circuit of the optical transmission module.

In the optical transmission module described above, a photodiode may be connected as an optical-electrical conversion unit to the high-frequency signal input unit, and a vertical-cavity surface-emitting laser (VCSEL) may be used as the electrical-optical conversion unit.

In order to achieve the above objects, a second aspect of the present disclosure provides an optical transmission module including
 a high-frequency signal input unit,
 an electrical-optical conversion unit that converts an electrical signal input from the high-frequency signal input unit into an optical signal and outputs the optical signal,
 a matching resistor that is connected in parallel to the electrical-optical conversion unit between the high-frequency signal input unit and the electrical-optical conversion unit,
 a power supply connection unit that is connected to a DC power supply and applies a voltage to drive the electrical-optical conversion unit,
 an inductor that is connected in series between the power supply connection unit and the electrical-optical conversion unit and that prevents a high-frequency signal from flowing from the high-frequency signal input unit to the power supply connection unit,
 a first capacitor that is connected in series between the matching resistor and the inductor and that prevents a direct current from flowing from the power supply connection unit to the matching resistor, and
 a second capacitor that is connected in series between the high-frequency signal input unit and the matching resistor.

With this configuration, no direct current flows from the power supply connection unit to the matching resistor; thus, only a high-frequency signal flows into the matching resistor.

In order to achieve the above objects, a third aspect of the present disclosure provides an optical data link enabling bidirectional optical transmission, the optical data link including optical transmission modules, and one or two optical cables, both ends of which are connected to the respective optical transmission modules, wherein the optical transmission modules each include a first line, one end of which is connected to a high-frequency signal input unit and the other end of which is connected to an optical-electrical conversion unit;
 a second line, one end of which is connected to an electrical-optical conversion unit that converts an electrical signal input from the high-frequency signal input unit into an optical signal and outputs the optical signal, the other end of which is connected to a power supply connection unit that is connected to a DC power supply and applies a voltage to drive the electrical-optical conversion unit; and
 a coupling portion at which the first line and the second line are electromagnetically coupled to each other via a predetermined space with a predetermined electrical length with respect to a wavelength of a frequency used,
 in a frequency band range in which an attenuation of coupling characteristics between the first line and the second line is lower than an attenuation of isolation characteristics between the first line and the second line,
 the electrical-optical conversion unit is connected to an end of the second line in the same direction as a propagation direction of a traveling wave of a high-frequency signal input from the high-frequency signal input unit to the first line, and the power supply connection unit is connected to the other end of the second line, in a frequency band range in which the attenuation of the coupling characteristics between the first line and the second line is higher than the attenuation of the isolation characteristics between the first line and the second line, the electrical-optical conversion unit is connected to an end of the second line in a direction opposite to a propagation direction of a traveling wave of a high-frequency signal input from the high-frequency signal input unit to the first line, and the power supply connection unit is connected to the other end of the second line, and the optical transmission modules connected to the respective ends of the one or two optical cables each include an E/O conversion processing unit from which an optical signal is output to the one or two optical cables, and an O/E conversion processing unit to which an optical signal is input from the one or two optical cables.

In order to achieve the above objects, a fourth aspect of the present disclosure provides an optical transmission system enabling transmission of an optical signal from a transmission-side device to a reception-side device via the optical data link.

Advantageous Effects of the Disclosure

According to the present disclosure, without a matching circuit, a high-frequency signal is propagated only to the electrical-optical conversion unit according to the frequency band used, due to the attenuation relationship between the coupling characteristics and the isolation characteristics. Therefore, the present disclosure provides an optical transmission module, an optical data link, and an optical transmission system with a small size at low cost.

BRIEF DESCRIPTION OF THE DRAWINGS

The optical transmission module of the present disclosure has higher power efficiency than conventional optical transmission modules because no current flows from the power supply connection unit to the matching resistor. This allows formation of a wiring circuit with a pattern and achieves significantly better high-frequency characteristics. [Brief Description of the Drawings]

DETAILED DESCRIPTION OF THE PREFERRED EMBODIMENT

Figure 1A:
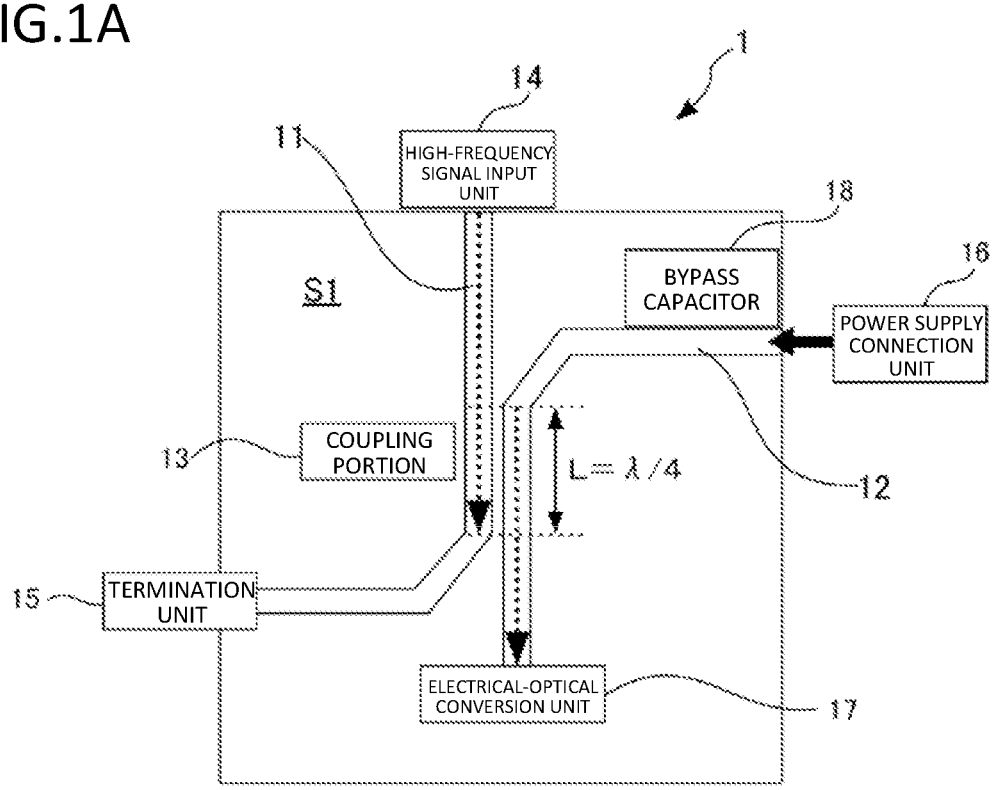
FIG. 1A is a schematic diagram of a circuit configuration of an optical transmission module according to a first embodiment, and shows a propagation direction of a high-frequency signal when a coupling portion has an electrical length of $\lambda/4$.

Embodiments of the present disclosure will be described with reference to the drawings. When a subsequent embodiment includes components corresponding to those of the previously described embodiments, the components are denoted by the same reference numerals, and redundant description is omitted. In each embodiment, when only a part of the configuration is described, the other parts of the configuration may be denoted by the reference numerals of the previously described embodiments. The embodiments may be partially combined even if it is not explicitly stated that the embodiments can be combined, provided there is no problem caused by inconsistency arising from the combination. The dimensions of the members in the drawings are exaggerated as appropriate to facilitate the description, and do not indicate the actual dimensions or ratios between the members.

Further areas of applicability will become apparent from the present description. The description and specific examples in this summary are intended for illustration purposes only, and are not intended to limit the scope of the present disclosure.

First Embodiment of Optical Transmission Module

Figure 1B:
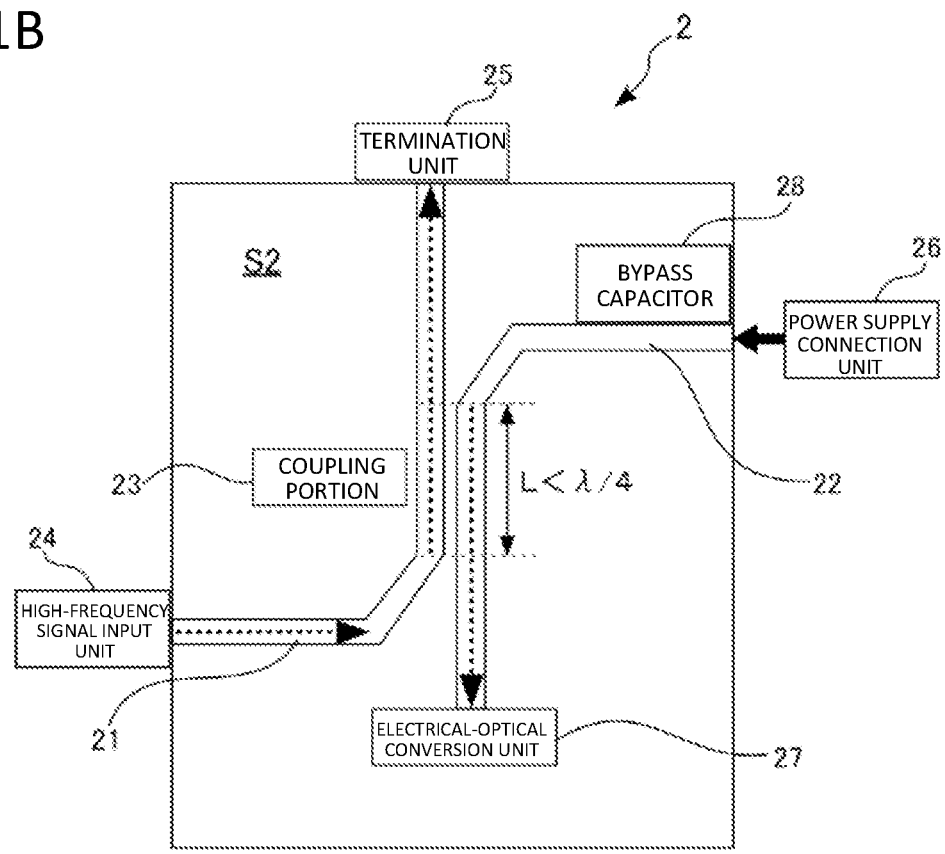
FIG. 1B is a schematic diagram of a circuit configuration of an optical transmission module according to the first embodiment, and shows a propagation direction of a high-frequency signal when a coupling portion has an electrical length of less than $\lambda/4$.

FIGS. 1A and 1B are a schematic diagram of a circuit configuration of an optical transmission module 1 and an optical transmission module 2 according to a first embodiment, respectively. The optical transmission module 1 in FIG. 1A includes a first line 11, a second line 12, and a coupling portion 13 on a surface of a circuit board S1. At the coupling portion 13, the first line 11 and the second line 12 are arranged in parallel with an electrical length L of $\lambda/4$ via a predetermined space that allows the first line 11 and the second line 12 to be electromagnetically coupled to each other.

One end of the first line 11 is connected to a high-frequency signal input unit 14, and the other end of the first line 11 is connected to a termination unit 15. The termination resistance of the termination unit 15 is, for example, the characteristic impedance of the first line 11. On the other hand, one end of the second line 12 is connected to a power supply connection unit 16, and the other end of the second line 12 is connected to an electrical-optical conversion unit 17. The electrical-optical conversion unit 17 converts an electrical signal input from the high-frequency signal input unit 14 into an optical signal, and outputs the optical signal. The power supply connection unit 16 is connected to a DC power supply, and applies a voltage to drive the electrical-optical conversion unit 17. The optical transmission module 1 may include a bypass capacitor 18 that connects the second line 12 to the ground, in order to avoid fluctuations in the voltage of the power supply connection unit 16 during operation of the circuit. Specifically, for example, a feed-through capacitor may be provided between the second line 12 and a metal case of the optical transmission module 1.

The dashed arrow shown in the first line 11 (arrow from the high-frequency signal input unit 14 toward the termination unit 15) indicates a direction in which a high-frequency signal is propagated (traveling wave). On the other hand, the dashed arrow shown in the second line 12 (arrow from the power supply connection unit 16 toward the electrical-optical conversion unit 17) indicates a direction in which the high-frequency signal transmitted via the coupling portion 13 is propagated when the electrical-optical conversion unit 17 is driven by a voltage applied from the DC power supply (not shown) connected to the power supply connection unit 16. In FIG. 1A, the direction of the dashed arrow in the second line 12 is the same as the direction of the arrow in the first line 11.

The optical transmission module 2 in FIG. 1B includes a first line 21, a second line 22, and a coupling portion 23 on a surface of a circuit board S2. At the coupling portion 23, the first line 21 and the second line 22 are arranged in parallel with an electrical length L of less than $\lambda/4$ via a predetermined space that allows the first line 21 and the second line 22 to be electromagnetically coupled to each other.

As in FIG. 1A, one end of the first line 21 is connected to a high-frequency signal input unit 24, and the other end of the first line 21 is connected to a termination unit 25. As in FIG. 1A, one end of the second line 22 is connected to a power supply connection unit 26, and the other end of the second line 22 is connected to an electrical-optical conversion unit 27. Furthermore, the optical transmission module 2 includes a bypass capacitor 28 that connects the second line 22 to the ground, for the same purpose as in FIG. 1A.

The dashed arrow shown in the first line 21 (arrow from the high-frequency signal input unit 24 toward the termination unit 25) indicates a direction in which a high-frequency signal is propagated (traveling wave). On the other hand, the dashed arrow shown in the second line 22 (arrow from the power supply connection unit 26 toward the electrical-optical conversion unit 27) indicates a direction in which the high-frequency signal transmitted via the coupling portion 23 is propagated when the electrical-optical conversion unit 27 is driven by a voltage applied from the power supply connection unit 26. In FIG. 1B, the direction of the dashed arrow in the second line 22 is opposite to the direction of the arrow in the first line 21.

The first lines 11 and 21 and the second lines 12 and 22 may be any transmission line through which an electromagnetic wave is transmitted, and are composed of, for example, a microstrip line or a coplanar line.

FIGS. 1A and 1B both show a configuration in which a first line and a second line are provided in the same plane; however, a first line, a second line, and a coupling portion may be provided in a multilayer substrate, for example, a three-layer substrate composed of a first dielectric substrate, a second dielectric substrate, and a third dielectric substrate. That is, the optical transmission module may have the following configuration. Specifically, the first line 11 (or the first line 21) is provided on a first surface of the first dielectric substrate, and the high-frequency signal input unit 14 (or the high-frequency signal input unit 24) and the termination unit 15 (or the termination unit 25) are provided on a second surface of the first dielectric substrate. The second line 12 (or the second line 22) is provided on a first surface of the second dielectric substrate, and the power supply connection unit 16 (or the power supply connection unit 26) and the electrical-optical conversion unit 17 (or the electrical-optical conversion unit 27) are provided on a second surface of the second dielectric substrate. The first dielectric substrate and the second dielectric substrate are laminated via a third dielectric substrate so that the first surface of the first dielectric substrate and the first surface of the second dielectric substrate face each other to form a three-layer substrate. In this case, the third dielectric substrate forms the coupling portion 13 (or the coupling portion 23) in the thickness direction of the third dielectric substrate.

As described above, in the optical transmission module 1 and the optical transmission module 2 of the present disclosure, the first line 11 (or the first line 21) and the second line 12 (or the second line 22) have a directional coupler structure. Thus, the optical transmission modules 1 and 2 allow propagation of a high-frequency signal in a desired direction through the second line 12 or the second line 22 according to the high-frequency characteristics, and prevent a high-frequency signal from flowing into the power supply connection unit 16 or the power supply connection unit 26. This eliminates the need for a matching circuit including an inductor and the like.

<Modification of First Embodiment of Optical Transmission Module>

Figure 2:
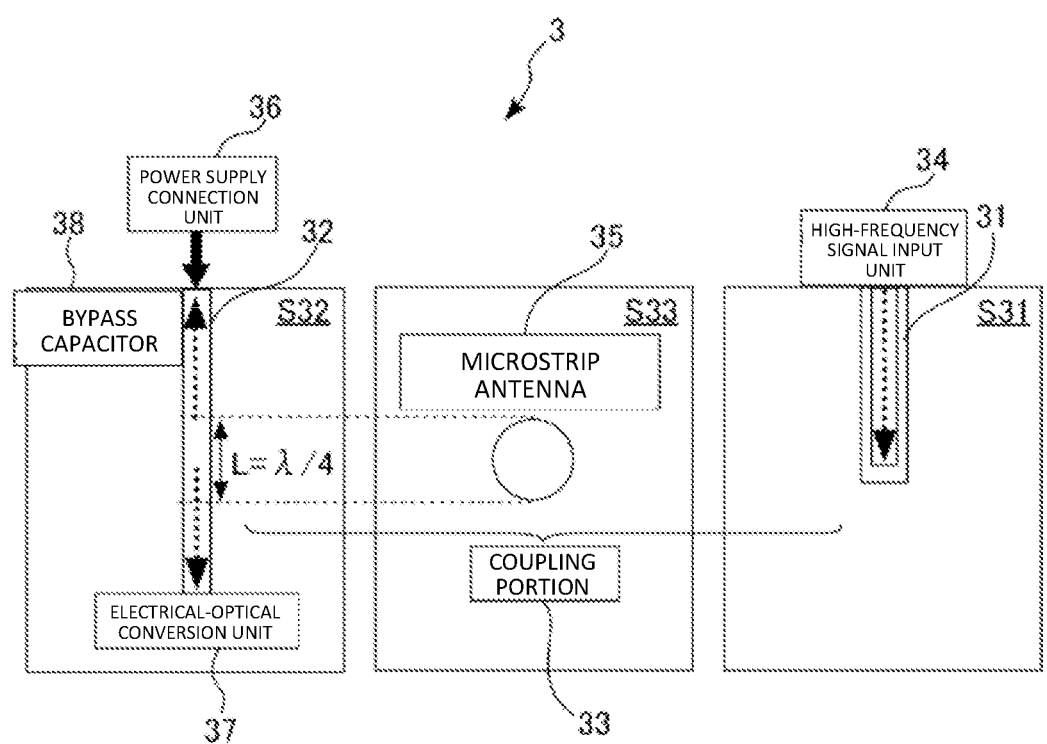
FIG. 2 is a schematic diagram of a modification of the circuit configuration of the optical transmission module according to the first embodiment.

FIG. 2 is a schematic diagram of an optical transmission module 3 as a modification of the first embodiment.

The optical transmission module 3 has a three-layer substrate structure composed of a lower-layer substrate S31, an upper-layer substrate S32, and an intermediate-layer substrate S33. A first line 31, one end of which is connected to a high-frequency signal input unit 34, is provided on the lower-layer substrate S31. A second line 32, one end of which is connected to a power supply connection unit 36 and the other end of which is connected to an electrical-optical conversion unit 37, is provided on the upper-layer substrate S32. On the intermediate-layer substrate S33, a microstrip antenna 35 is provided at a termination position of the first line 31. A bypass capacitor 38 may be connected to the end of the second line 32 which is connected to the power supply connection unit 36, in order to avoid fluctuations in the voltage of the power supply connection unit 36 during operation of the circuit.

The microstrip antenna 35 is resonantly coupled to the second line 32 with a predetermined electrical length (214 in the present embodiment) to form a coupling portion 33. In the present embodiment, the electrical-optical conversion unit 37 converts, into an optical signal, a component of a high-frequency signal input from the high-frequency signal input unit 34 to the first line 31 that is propagated via the microstrip antenna 35 through the second line 32 in the same direction as the direction in which the high-frequency signal is propagated through the first line 31.

Figure 3A:
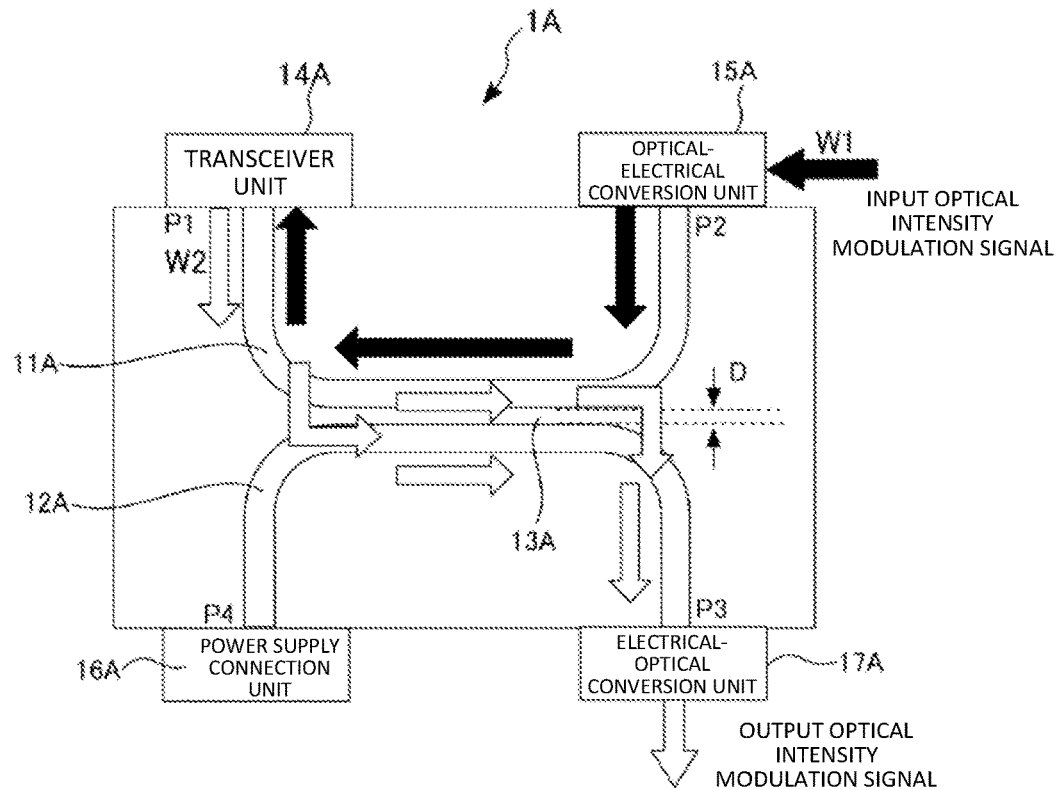
FIG. 3A is a schematic diagram of a specific embodiment for illustrating an operation of the optical transmission module according to the first embodiment, and shows a configuration of the specific embodiment of the optical transmission module in FIG. 1A.
Figure 3B:
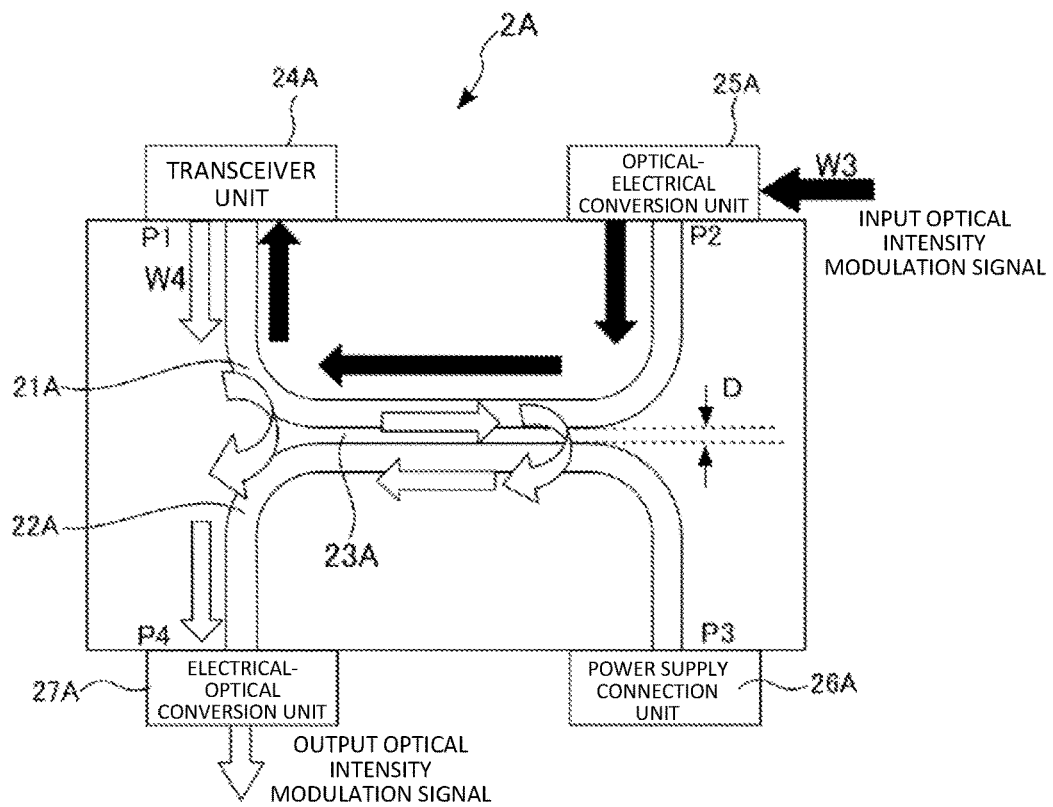
FIG. 3B is a schematic diagram of a specific embodiment for illustrating an operation of the optical transmission module according to the first embodiment, and shows a configuration of the specific embodiment of the optical transmission module in FIG. 1B.

Frequency Characteristics of Optical Transmission Module According to First Embodiment Frequency characteristics of the optical transmission module according to the first embodiment will be described with reference to FIGS. 3 to 9. FIG. 3A shows an optical transmission module 1A according to a specific embodiment of the optical transmission module 1 shown in FIG. 1A, and FIG. 3B shows an optical transmission module 2A according to a specific embodiment of the optical transmission module 2 shown in FIG. 1B.

As shown in FIG. 3A, the optical transmission module 1A has four ports, specifically, ports P1 to P4. The port P1 and the port P2 are adjacent to each other, and are physically connected to the respective ends of a first line 11A having a U-shape. Similarly, the port P3 and the port P4 are adjacent to each other, and are physically connected to the respective ends of a second line 12A having a U-shape. At the bottom portion of the U-shape, the first line 11A and the second line 12A are arranged in parallel to face each other via a predetermined space D to form a coupling portion 13A at which the first line 11A and the second line 12A are electromagnetically coupled to each other.

The port P1 connected to one end of the first line 11A is connected to a transceiver unit 14A such as an antenna that functions as a high-frequency signal input unit. The port P2 connected to the other end of the first line 11A is connected to a termination unit of the transceiver unit 14A. In the present embodiment, the port P2 is connected to an optical-electrical conversion unit 15A. The optical-electrical conversion unit 15A is, for example, a photodiode, and an optical intensity modulation signal is input from an optical cable (not shown) to the optical-electrical conversion unit 15A. As indicated by the black solid arrow W1, the optical intensity modulation signal is input from the optical cable to the port P2 and converted into an electrical signal by the optical-electrical conversion unit 15A, and the electrical signal is propagated to the port P1 through the first line 11A and is transmitted to a connected device (not shown) via the transceiver unit 14A connected to the port P1.

The port P3 connected to one end of the second line 12A is connected to an electrical-optical conversion unit 17A. The electrical-optical conversion unit 17A is, for example, a vertical-cavity surface-emitting laser (VCSEL), and is connected to an optical cable (not shown) and outputs an optical intensity modulation signal to the optical cable. The port P4 connected to the other end of the second line 12A is connected to a power supply connection unit 16A. As indicated by the white hollow arrow W2, a high-frequency signal (electrical signal) received by the transceiver unit 14A connected to the port P1 is propagated through the first line 11A toward the port P2, and is also propagated via the coupling portion 13A toward the port P3 of the second line 12A (i.e., in the same direction as the direction in which the high-frequency signal is propagated through the first line 11A). Furthermore, a predetermined voltage is applied from a DC power supply (not shown) connected to the power supply connection unit 16A at the port P4 to cause excitation oscillation of the electrical-optical conversion unit 17A, and a DC component is added to the high-frequency signal and supplied to the electrical-optical conversion unit 17A. The high-frequency signal is converted into an optical intensity modulation signal by the electrical-optical conversion unit 17A, and the optical intensity modulation signal is output to the optical cable.

As shown in FIG. 3B, as with the optical transmission module 1A, the optical transmission module 2A has four ports, specifically, ports P1 to P4. A first line 21A and a second line 22A have a U-shape, and at the bottom portion of the U-shape, the first line 21A and the second line 22A are arranged in parallel to face each other via a predetermined space D to form a coupling portion 23A at which the first line 21A and the second line 22A are electromagnetically coupled to each other.

As with the optical transmission module 1A, the port P1 connected to one end of the first line 21A is connected to a transceiver unit 24A, and the port P2 connected to the other end of the first line 21A is connected to a termination unit of the transceiver unit 24A. In the present embodiment, the port P2 is connected to an optical-electrical conversion unit 25A. The optical-electrical conversion unit 25A such as a photodiode is connected to an optical cable (not shown), and an optical intensity modulation signal is input from the optical cable to the optical-electrical conversion unit 25A. As indicated by the black solid arrow W3, the optical intensity modulation signal is input from the optical cable to the port P2 and converted into an electrical signal by the optical-electrical conversion unit 25A, and the electrical signal is propagated to the port P1 through the first line 21A and is transmitted to a connected device (not shown) via the transceiver unit 24A connected to the port P1.

The port P3 connected to one end of the second line 22A is connected to a power supply connection unit 26A. The other end of the second line 22A is connected to an electrical-optical conversion unit 27A such as a VCSEL. The electrical-optical conversion unit 27A is connected to an optical cable (not shown), and outputs an optical intensity modulation signal to the optical cable. As indicated by the white hollow arrow W4, a high-frequency signal (electrical signal) received by the transceiver unit 24A connected to the port P1 is propagated through the first line 21A toward the port P2, and is also propagated via the coupling portion 23A toward the port P4 of the second line 22A (i.e., in a direction opposite to the direction in which the high-frequency signal is propagated through the first line 21A). Furthermore, a predetermined voltage is applied from a DC power supply (not shown) connected to the power supply connection unit 26A at the port P3 to cause excitation oscillation of the electrical-optical conversion unit 27A, and a DC component is added to the electrical signal and supplied to the electrical-optical conversion unit 27A. The electrical signal is converted into an optical intensity modulation signal by the electrical-optical conversion unit 27A, and the optical intensity modulation signal is output to the optical cable.

Figure 4:
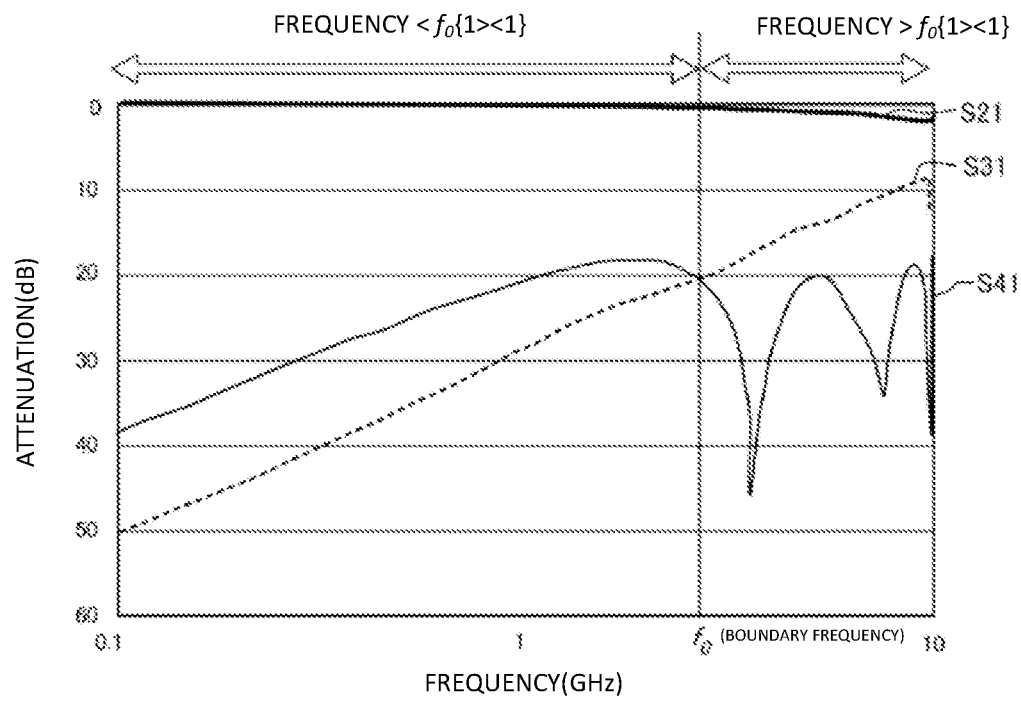
FIG. 4 is a graph showing, using S-parameters, propagation characteristics of ports of the optical transmission modules of the specific embodiments in FIGS. 3A and 3B.

FIG. 4 is a graph showing, using S-parameters, propagation characteristics of the ports of the optical transmission module 1A and the optical transmission module 2A of the specific embodiments in FIG. 3.

In the graph shown in FIG. 4, the horizontal axis represents a frequency (GHz), and the vertical axis represents an attenuation (dB). The graph in FIG. 4 shows characteristic values for the four ports P1 to P4 of the optical transmission module 1A and the optical transmission module 2A in FIG. 3, where S21 represents an output of the signal propagating from P1 to P2 (insertion loss), S31 represents an output of the signal propagating from P1 to P3 (coupling characteristics), and S41 represents an output of the signal propagating from P1 to P4 (isolation characteristics). The coupling portion 13A and the coupling portion 23A have an electrical length of $\lambda/4$ with respect to a transmission line wavelength of a specified frequency.

As shown in the graph in FIG. 4, in the frequency band range in which the attenuation of the isolation characteristics S41 is lower than the attenuation of the coupling characteristics S31, the propagation direction of the high-frequency signal through the first line is opposite to the propagation direction of the high-frequency signal through the second line. Thus, in this frequency band range, the optical transmission module 2A in FIG. 3B can be used in which the electrical-optical conversion unit 27A is connected to the port P4 and the power supply connection unit 26A is connected to the port P3. On the other hand, in the frequency band range in which the attenuation of the isolation characteristics S41 is higher than the attenuation of the coupling characteristics S31, the propagation direction of the high-frequency signal through the first line is the same as the propagation direction of the high-frequency signal through the second line. Thus, in this frequency band range, the optical transmission module 1A in FIG. 3A can be used in which the electrical-optical conversion unit 17A is connected to the port P3 and the power supply connection unit 16A is connected to the port P4. That is, the optical transmission module 2A can be used to input a high-frequency signal having a frequency lower than a boundary frequency $f_0$, and the optical transmission module 1A can be used to input a high-frequency signal having a frequency higher than the boundary frequency $f_0$, where the boundary frequency $f_0$ represents the frequency at which the isolation characteristics S41 intersects with the coupling characteristics S31.

Figure 5A:
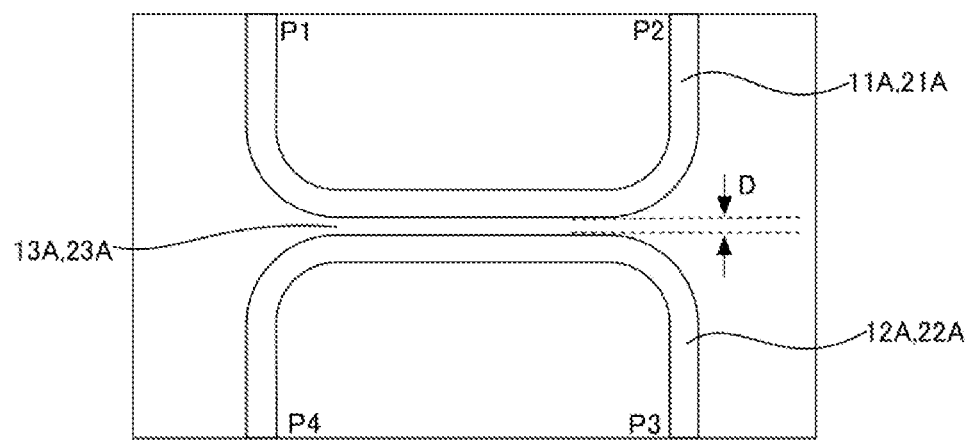
FIG. 5A is a partial enlarged schematic diagram of the coupling portion of the first embodiment, and is a partial enlarged view of the coupling portion at which the first line and the second line are arranged in parallel with a total electrical length of $\lambda/4$.
Figure 5B:
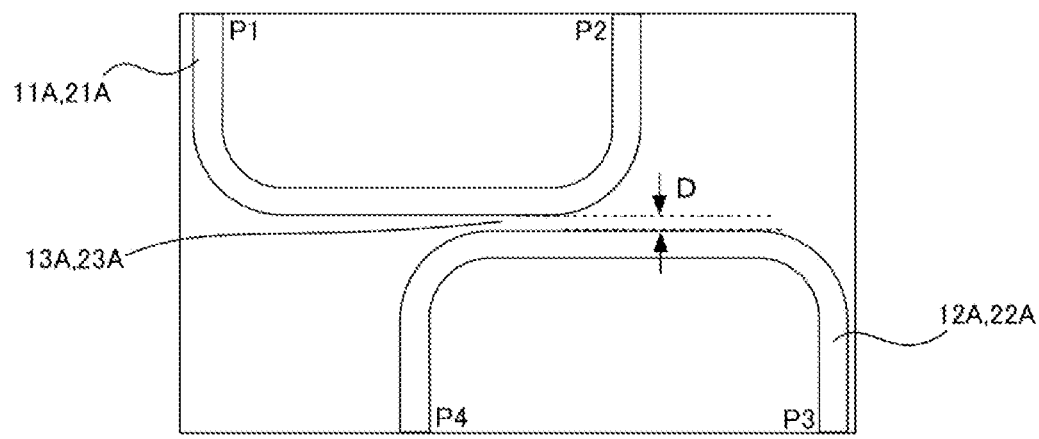
FIG. 5B is a partial enlarged schematic diagram of the coupling portion of the first embodiment, and is a partial enlarged view of the coupling portion at which the first line and the second line are shifted in the horizontal direction from the position of the first line and the second line arranged in parallel in FIG. 5A.
Figure 6A:
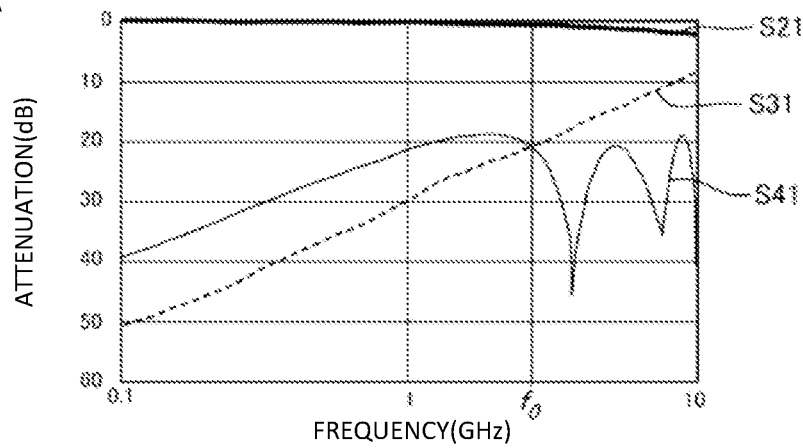
FIG. 6A is a graph showing, using S-parameters, the propagation characteristics of the ports for the coupling portion in FIG. 5A when a space D is 1.2 mm.
Figure 6B:
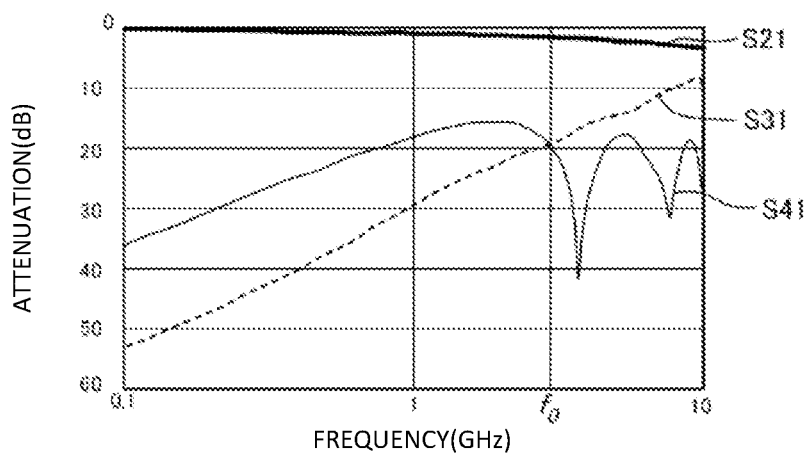
FIG. 6B is a graph showing, using S-parameters, the propagation characteristics of the ports for the coupling portion in FIG. 5A when the space D is 0.7 mm.
Figure 6C:
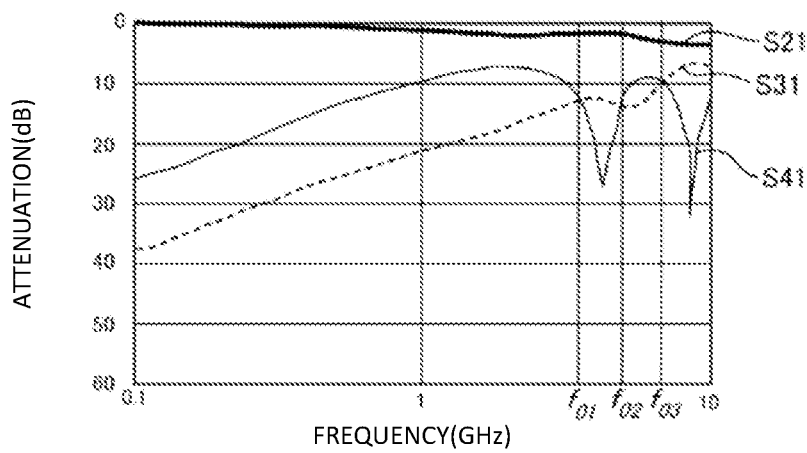
FIG. 6C is a graph showing, using S-parameters, the propagation characteristics of the ports for the coupling portion in FIG. 5A when the space D is 0.17 mm.
Figure 7A:
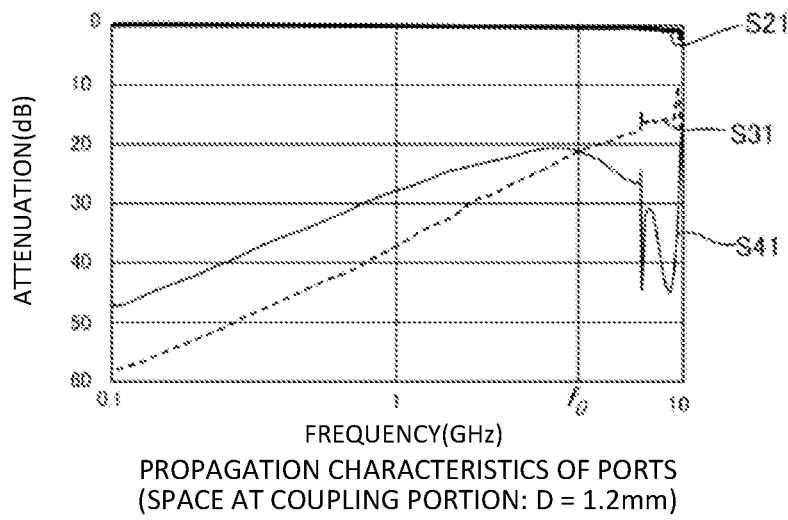
FIG. 7A is a graph showing, using S-parameters, the propagation characteristics of the ports for the coupling portion in FIG. 5B when a space D is 1.2 mm.
Figure 7B:
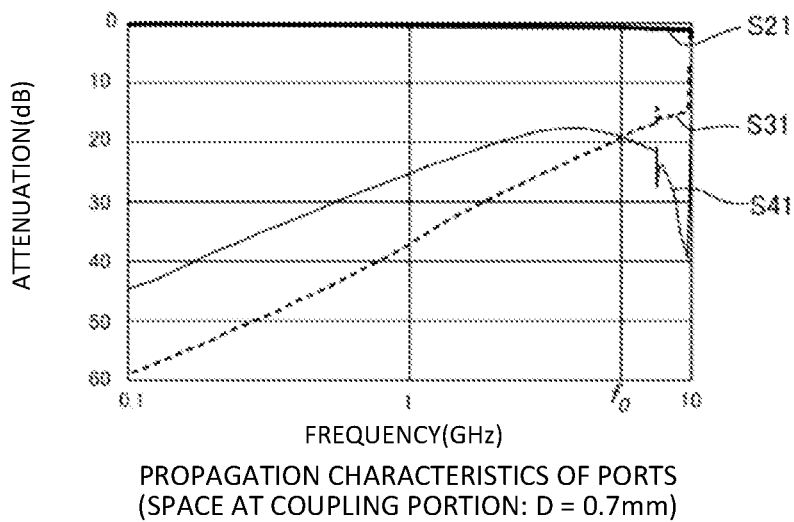
FIG. 7B is a graph showing, using S-parameters, the propagation characteristics of the ports for the coupling portion in FIG. 5B when the space D is 0.7 mm.
Figure 7C:
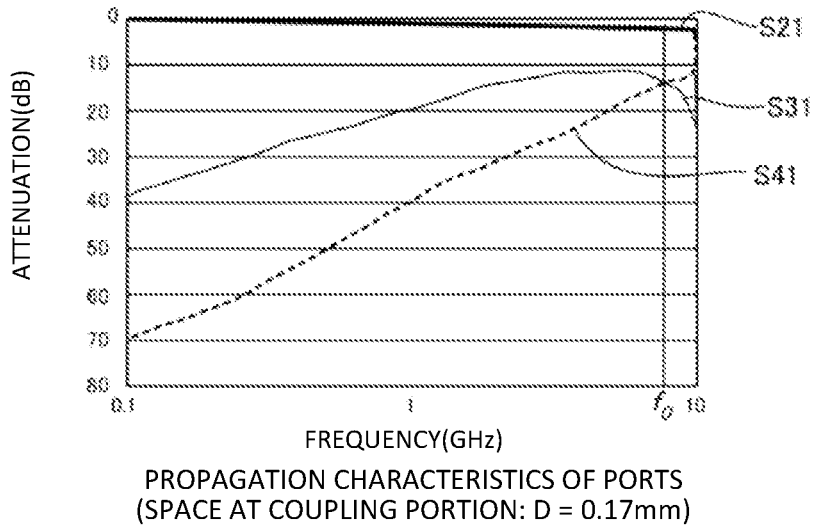
FIG. 7C is a graph showing, using S-parameters, the propagation characteristics of the ports for the coupling portion in FIG. 5B when the space D is 0.17 mm.

FIGS. 5A and 5B are partial enlarged schematic diagrams of the coupling portion 13A of the optical transmission module 1A and the coupling portion 23A of the optical transmission module 2A according to the specific embodiments in FIG. 3. FIG. 5A is a partial enlarged view of the coupling portion at which the first line and the second line are arranged in parallel with a total electrical length of $\lambda/4$, where $\lambda$ represents a wavelength of a specified frequency. FIG. 5B is a partial enlarged view of the coupling portion at which the first line and the second line are shifted in the horizontal direction from the position of the first line and the second line arranged in parallel in FIG. 5A. FIGS. 6A to 6C are graphs showing, using S-parameters, the propagation characteristics of the ports (port P2, port P3, port P4) when the space D at the coupling portion in FIG. 5A is varied. FIGS. 7A to 7C are a graph showing, using S-parameters, the propagation characteristics of the ports (port P2, port P3, port P4) when the space D at the coupling portion in FIG. 5B is varied. In FIGS. 6A and 7A, D=1.2 mm, in FIGS. 6B and 7B, D=0.7 mm, and in FIGS. 6C and 7C, D=0.17 mm.

As shown in the graphs in FIGS. 6A to 6C, in FIG. 6A, the boundary frequency $f_0$ is approximately 2.5 GHz, in FIG. 6B, the boundary frequency $f_0$ is approximately 3 GHz, and in FIG. 6C, three boundary frequencies are observed in the range of 3 to 7 GHz. With regard to the change in attenuation, the attenuation of S31 (coupling characteristics) in the forward direction is slightly influenced by the variation in the space D; however, the attenuation of S41 (isolation characteristics) in the reverse direction tends to be reduced as the space D is reduced.

Thus, when the frequency used is less than the boundary frequency $f_0$, as the space D at the coupling portion 13A and the coupling portion 23A is reduced, the output S41 is increased.

As shown in the graphs in FIGS. 7A to 7C, in FIG. 7A, the boundary frequency $f_0$ is approximately 4.5 GHz, in FIG. 7B, the boundary frequency $f_0$ is approximately 5.5 GHz, and in FIG. 7C, the boundary frequency $f_0$ is approximately 7.5 GHz. With regard to the change in attenuation, as in FIGS. 6A to 6C, the attenuation of S31 (coupling characteristics) in the forward direction is slightly influenced by the variation in the space D; however, the attenuation of S41 (isolation characteristics) in the reverse direction tends to be reduced as the space D is reduced.

When the frequency used is less than the boundary frequency $f_0$, as the space D at the coupling portion 13A and the coupling portion 23A is reduced, the boundary frequency $f_0$ is shifted toward the higher frequency side and the attenuation of S41 is reduced; thus, the output is increased. Furthermore, the difference between S31 and S41 is increased. Thus, an optimum value of the space D at the coupling portion 13A and the coupling portion 23A can be determined based on the above characteristics.

Figure 8A:
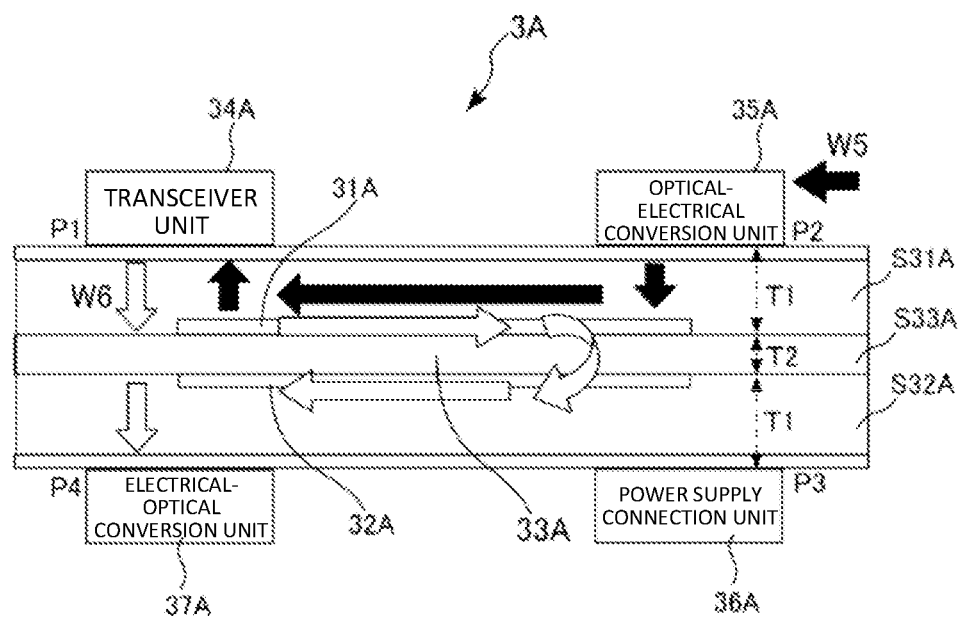
FIG. 8A is a schematic diagram of a specific embodiment of an optical transmission module of the first embodiment composed of a three-layer substrate, and is a side cross-sectional view.
Figure 8B:
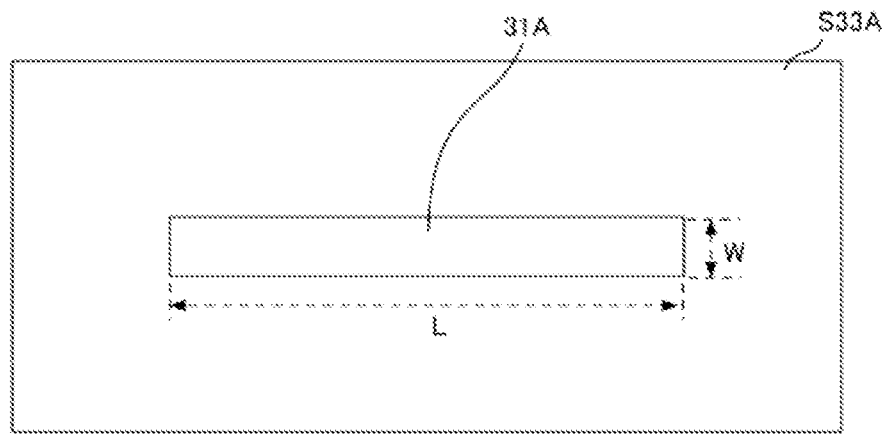
FIG. 8B is a schematic diagram of the specific embodiment of the optical transmission module of the first embodiment composed of a three-layer substrate, and is a schematic top view of a coupling portion on an upper-layer dielectric substrate.

FIGS. 8A and 8B are a schematic diagram of a specific embodiment of an optical transmission module of the first embodiment composed of a three-layer dielectric substrate.

Figure 9A:
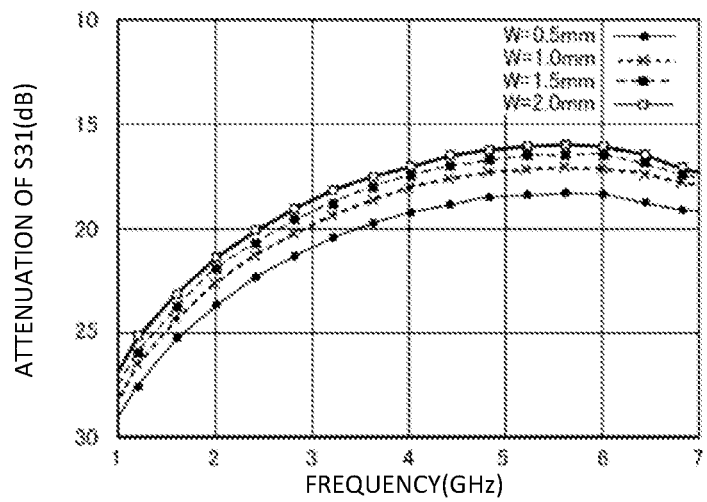
FIG. 9A is a graph showing characteristics of the optical transmission module in FIGS. 8A and 8B, and is a graph showing frequency characteristics of a port P3.
Figure 9B:
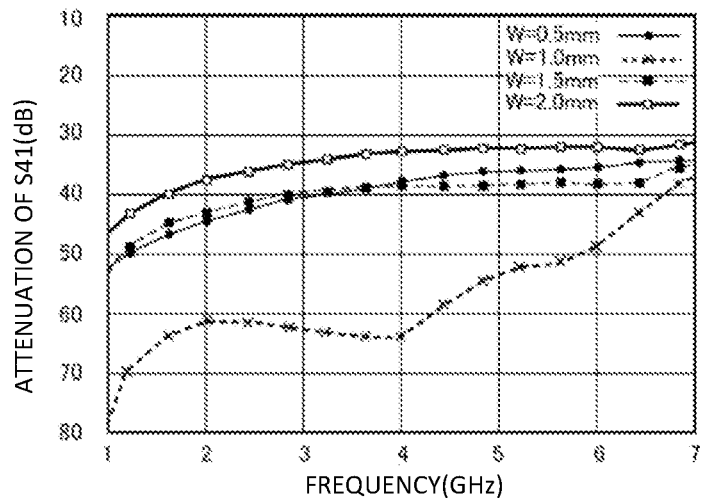
FIG. 9B is a graph showing characteristics of the optical transmission module in FIGS. 8A and 8B, and is a graph showing frequency characteristics of a port P4.
Figure 9C:
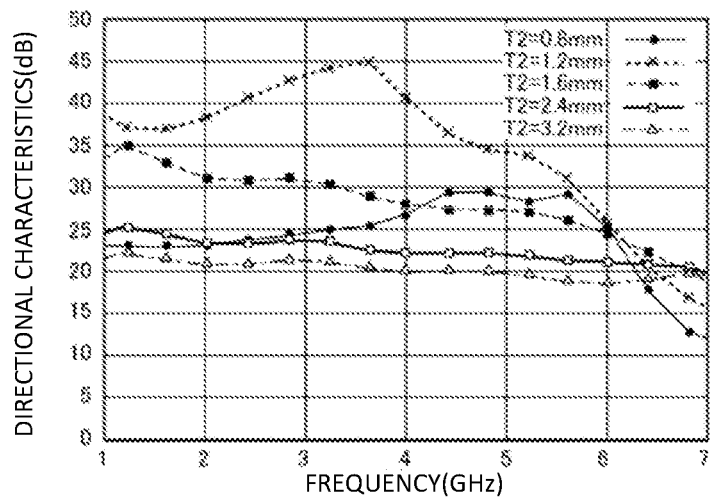
FIG. 9C is a graph showing characteristics of the optical transmission module in FIGS. 8A and 8B, and is a graph showing directional characteristics of the optical transmission module.

FIG. 8A is a side cross-sectional view, and FIG. 8B is a schematic top view of a coupling portion on an upper-layer dielectric substrate. FIGS. 9A, 9B, and 9C are a graph showing characteristics of the optical transmission module in FIG. 8. FIG. 9A is a graph showing frequency characteristics of a port P3, FIG. 9B is a graph showing frequency characteristics of a port P4, and FIG. 9C is a graph showing directional characteristics of the optical transmission module.

An optical transmission module 3A in FIGS. 8A and 8B has the same basic configuration as the optical transmission module 2A in FIG. 3B, and thus redundant detailed description of the configuration is omitted. In the optical transmission module 3A, a surface of an upper-layer dielectric substrate S31A is composed of a metal plate, and a port P1 and a port P2 are provided on the surface. The port P1 is connected to a transceiver unit 34A, and the port P2 is connected to an optical-electrical conversion unit 35A.

A surface of a lower-layer dielectric substrate S32A is also composed of a metal plate, and the port P3 and the port P4 are provided on the surface thereof. The port P4 is connected to an electrical-optical conversion unit 37A, and the port P3 is connected to a power supply connection unit 36A that is connectable to a DC power supply.

A first line 31A is provided on an upper surface of an intermediate dielectric substrate S33A, that is, a surface of the upper-layer dielectric substrate S31A opposite to the surface composed of a metal plate of the upper-layer dielectric substrate S31A. A second line 32A is provided on an upper surface of the lower-layer dielectric substrate S32A, that is, a lower surface of the intermediate dielectric substrate S33A opposite to the upper surface of the intermediate dielectric substrate S33A.

The upper-layer dielectric substrate S31A and the lower-layer dielectric substrate S32A each have a thickness T1. The intermediate dielectric substrate S33A has a thickness T2 corresponding to the space D in FIG. 3. The intermediate dielectric substrate S33A, together with the first line 31A and the second line 32A, forms a coupling portion 33A.

FIG. 8B shows a line length L and a line width W of the first line 31A provided on the intermediate dielectric substrate S33A. Although FIG. 8B shows the line length L and the line width W of the first line 31A, the second line 32A also has a line length L (not shown) the same as the line length L of the first line 31A, and a line width W (not shown; may be different from the line width W of the first line 31A). In FIG. 8A, as in FIG. 3B, as indicated by the black solid arrow W5, an optical intensity modulation signal input to the optical-electrical conversion unit 35A is propagated from the port P2 to the port P1. On the other hand, as indicated by the white hollow arrow W6, a high-frequency signal received by the transceiver unit 34A connected to the port P1 is propagated through the first line 31A toward the port P2, and is also propagated via the coupling portion 33A toward the port P4 of the second line 32A (i.e., in a direction opposite to the direction in which the high-frequency signal is propagated through the first line 31A). As in the embodiment in FIG. 3A, the optical transmission module may be configured such that an electrical signal is propagated through the second line in the same direction as the direction in which the electrical signal is propagated through the first line (not shown).

FIGS. 9A and 9B are a graph showing the characteristics of the optical transmission module in FIG. 8. FIG. 9A is a graph showing the frequency characteristics of the port P3 of the optical transmission module 3A in FIG. 8, the horizontal axis represents a frequency (GHz), and the vertical axis represents an attenuation (dB) indicating the coupling characteristics S31 from the port P1 to the port P3. The thickness T1 of the upper-layer dielectric substrate S31A and the lower-layer dielectric substrate S32A is 0.8 mm, and the thickness T2 of the intermediate dielectric substrate S33A is 1.2 mm. The coupling characteristics are compared for a line width W of 0.5 mm, 1.0 mm, 1.5 mm, and 2.0 mm.

FIG. 9B is a graph showing the frequency characteristics of the port P4 of the optical transmission module 3A in FIG. 8, the horizontal axis represents a frequency (GHz), and the vertical axis represents an attenuation (dB) indicating the isolation characteristics S41 from the port P1 to the port P4. The thickness T1 of the upper-layer dielectric substrate S31A and the lower-layer dielectric substrate S32A and the thickness T2 of the intermediate dielectric substrate S33A are the same as those shown in FIG. 9A. The isolation characteristics are compared for each line width W as in FIG. 9A.

FIG. 9C is a graph showing the directional characteristics of the optical transmission module 3A in FIG. 8, the horizontal axis represents a frequency (GHz), and the vertical axis represents an amount (dB) indicating the directional characteristics of the port P3 and the port P4. The line width W is 1.0 mm, and the thickness T1 of the upper-layer dielectric substrate S31A and the lower-layer dielectric substrate S32A is 0.8 mm. The directional characteristics are compared for a thickness T2 of the intermediate dielectric substrate S33A of 0.8 mm, 1.2 mm, 1.6 mm, 2.4 mm, and 3.2 mm.

The graphs in FIGS. 9A to 9C show that the coupling characteristics S31 are greatly different from the isolation characteristics S41 when the thickness T2 of the intermediate dielectric substrate S33A (i.e., the coupling portion 33A) is 1.2 mm.

As has been described, in the optical transmission module according to the first embodiment of the present disclosure, without a matching circuit, a high-frequency signal is propagated only to the electrical-optical conversion unit according to the frequency band used, due to the attenuation relationship between the coupling characteristics and the isolation characteristics, thus achieving lower cost and smaller size.

<Optical Data Link>

Figure 10A:
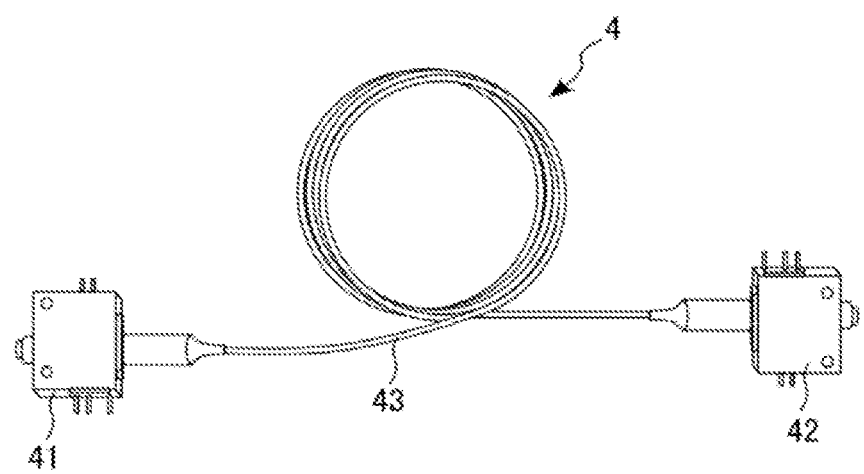
FIG. 10A shows an optical data link, and is an external view of the optical data link.
Figure 10B:
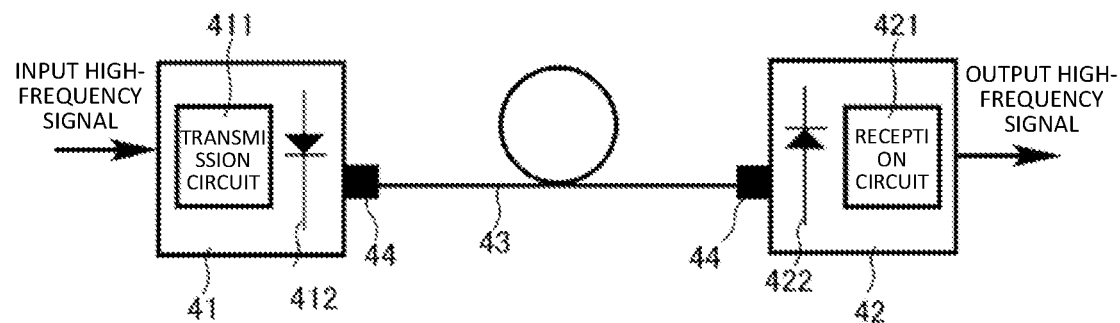
FIG. 10B shows the optical data link, and is a schematic diagram of a configuration of the optical data link.

FIGS. 10A and 10B show an optical data link. FIG. 10A is an external view of the optical data link, and FIG. 10B is a schematic diagram of a configuration of the optical data link.

An optical data link 4 is composed of optical transmission modules 41 and 42 that have one of the circuit configurations described with reference to FIGS. 1 to 9, and an optical cable 43 that is connected between the optical transmission module 41 and the optical transmission module 42.

The optical transmission module 41 and the optical transmission module 42 each include a transceiver unit such as an antenna (corresponding to a high-frequency signal input-output unit) and an optical-electrical conversion unit such as a photodiode (corresponding to a termination unit) that are connected to the respective ends of a first line; a power supply connection unit and an electrical-optical conversion unit such as a vertical-cavity surface-emitting laser that are connected to the respective ends of a second line; and a coupling portion at which the first line and the second line are electromagnetically coupled to each other.

That is, the optical transmission module 41 and the optical transmission module 42 integrally include both the vertical-cavity surface-emitting laser and the photodiode. Therefore, in the optical data link 4 of the present disclosure, the optical transmission modules 41 and 42 at both ends of the optical data link 4 include an E/O conversion processing unit from which an optical signal is output to the optical cable 43 and an O/E conversion processing unit to which an optical signal is input from the optical cable 43. Thus, the optical data link 4 enables bidirectional optical transmission by selecting a device to be connected.

In the optical transmission module 41 and the optical transmission module 42, in the frequency band range in which the attenuation of the coupling characteristics between the first line and the second line is lower than the attenuation of the isolation characteristics between the first line and the second line, the electrical-optical conversion unit is connected to an end of the second line in the same direction as the propagation direction of a traveling wave of a high-frequency signal input from the high-frequency signal input unit to the first line, and the power supply connection unit is connected to the other end of the second line. On the other hand, in the frequency band range in which the attenuation of the coupling characteristics between the first line and the second line is higher than the attenuation of the isolation characteristics between the first line and the second line, the electrical-optical conversion unit is connected to an end of the second line in a direction opposite to the propagation direction of a traveling wave of a high-frequency signal input from the high-frequency signal input unit to the first line, and the power supply connection unit is connected to the other end of the second line. Thus, an optical transmission module having one of the above configurations may be selected according to the frequency band of a device to be connected using the optical data link 4.

In FIG. 10B, the optical transmission modules 41 and 42 are connected to the respective ends of one or two optical cables 43 via optical connectors 44. The optical transmission module 41 functions as an E/O conversion processing unit. When a high-frequency signal is input to the optical transmission module 41 from the outside, the high-frequency signal is converted into an optical signal by a vertical-cavity surface-emitting laser 412, and the optical signal is transmitted from a transmission circuit 411 to the optical cable 43. On the other hand, the optical transmission module 42 functions as an O/E conversion processing unit. When the optical transmission module 42 receives the optical signal from the optical cable 43, the optical signal is converted into an electrical signal by a photodiode 422, and the high-frequency signal is output from a reception circuit 421 to a connected device.

<Optical Transmission System>

Figure 11:
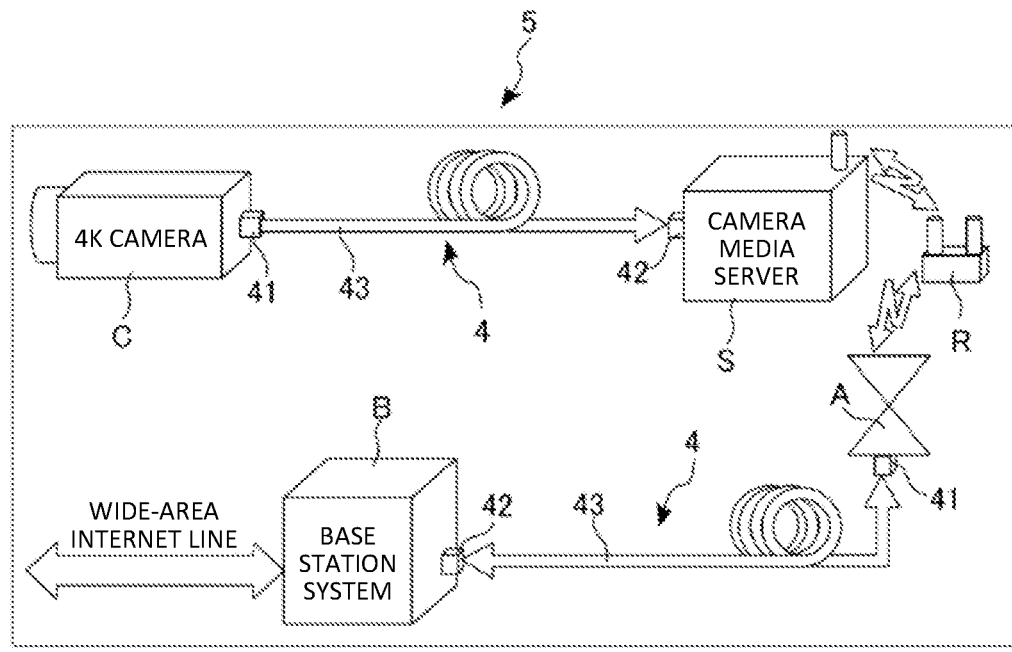
FIG. 11 is a block diagram of an optical transmission system in which a 4K camera, a camera media server, and a local 5G base station system are connected to each other by an optical data link.

FIG. 11 is a block diagram showing an example of an optical transmission system in which a 4K camera, a camera media server, and a local 5G base station system are connected to each other by an optical data link.

An optical transmission system 5 includes a 4K camera C as a transmission-side device from which a high-frequency signal is output; the optical data link 4 composed of the optical transmission module 41 that converts the high-frequency signal into an optical signal, the optical cable 43 that transmits the optical signal to the optical transmission module 42, and the optical transmission module 42 that receives the optical signal from the optical cable 43 and converts the optical signal into an electrical signal; and a camera media server S as a reception-side device to which the converted electrical signal is input.

Furthermore, in the optical transmission system 5 of the present disclosure, an electrical signal received by the camera media server S is transmitted from a Wi-Fi (registered trademark) antenna of the camera media server S to an antenna A via a router R. Then, the electrical signal is converted again via the optical data link 4 into an optical signal and the optical signal is converted again into an electrical signal, and the electrical signal is transmitted to a base station system B and distributed through a wide-area internet line.

The frequency band used between the 4K camera C and the camera media server S is different from the frequency band used between the antenna A and the base station system B. By selecting the optical transmission modules 41 and 42 according to the frequency used, the optical data link 4 can cover various frequency bands and constitute the optical transmission system 5.

Second Embodiment of Optical Transmission Module

Figure 12:
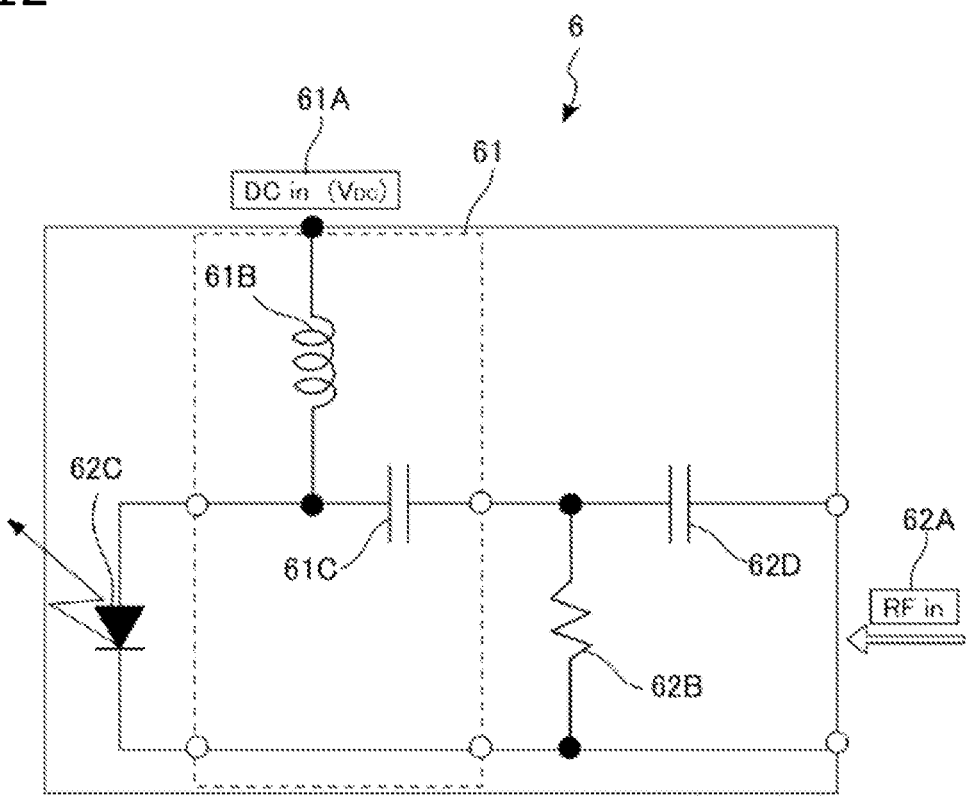
FIG. 12 is an equivalent circuit diagram of an electrical-optical conversion circuit of an optical transmission module according to a second embodiment.

FIG. 12 is an equivalent circuit diagram of an electrical-optical conversion circuit of an optical transmission module according to a second embodiment. An electrical-optical conversion circuit 6 is composed of a high-frequency signal circuit and a bias circuit.

The high-frequency signal circuit includes a high-frequency signal input unit 62A, and an electrical-optical conversion unit 62C (e.g., vertical-cavity surface-emitting laser) that converts an electrical signal input from the high-frequency signal input unit 62A into an optical signal and outputs the optical signal.

The bias circuit is composed of a power supply connection unit 61A that applies a bias voltage to the electrical-optical conversion unit 62C to excite the electrical-optical conversion unit 62C, and a bias-T circuit 61. The bias-T circuit 61 includes an inductor 61B that is connected in series between a DC power supply connected to the power supply connection unit 61A and the electrical-optical conversion unit 62C and that prevents a high-frequency signal from flowing from the high-frequency signal input unit 62A to the power supply connection unit 61A, and a first capacitor 61C for preventing a large direct current from flowing into the high-frequency signal input unit 62A. That is, the bias-T circuit 61 is provided to eliminate mutual influence between the high-frequency signal circuit and the bias circuit.

A matching resistor 62B is connected in parallel to the electrical-optical conversion unit 62C between the high-frequency signal input unit 62A and the electrical-optical conversion unit 62C to match the characteristic impedance of the high-frequency signal circuit to that of the electrical-optical conversion unit 62C.

The matching resistor 62B is connected in series to the inductor 61B and the first capacitor 61C, and thus prevents a direct current from flowing from the power supply connection unit 61A.

Furthermore, the matching resistor 62B is connected in series to a second capacitor 62D between the high-frequency signal input unit 62A and the matching resistor 62B. Even when the high-frequency signal input unit 62A has a direct current, the second capacitor 62D prevents the direct current from flowing through the matching resistor 62B.

As described above, the matching resistor 62B is connected in series to the power supply connection unit 61A via the first capacitor 61C, and is connected in series to the high-frequency signal input unit 62A via the second capacitor 62D, thus eliminating a DC component flowing through the matching resistor 62B. Therefore, the power consumption of the matching resistor 62B does not need to be considered in circuit design. This achieves higher power efficiency, and enables the matching resistor 62B to have a small physical size, allowing formation of a wiring circuit with a pattern and achieving significantly better high-frequency characteristics.

Modification of Second Embodiment

Figure 13:
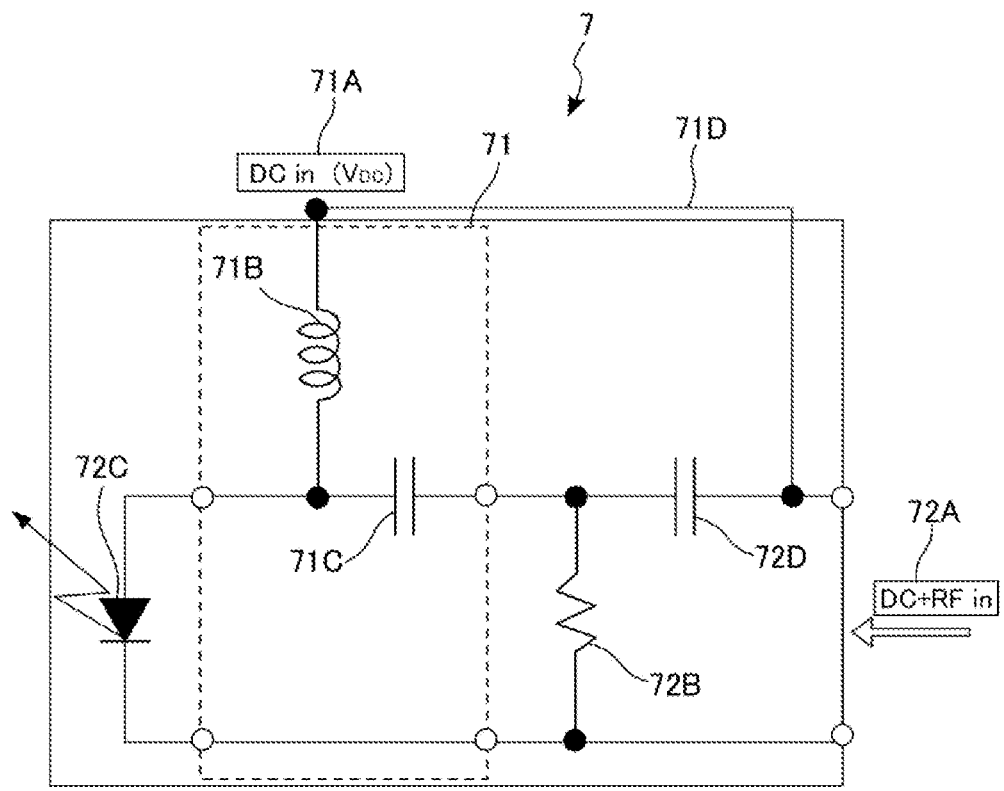
FIG. 13 is an equivalent circuit diagram of a modification of the electrical-optical conversion circuit according to the second embodiment.
Figure 14:
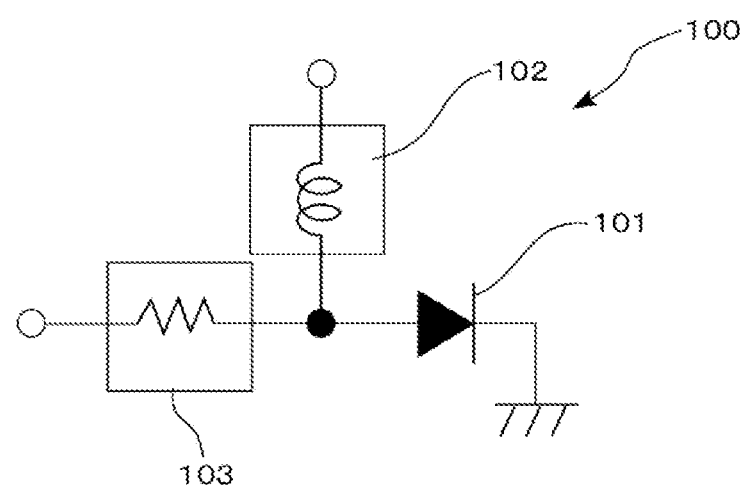
FIG. 14 is an equivalent circuit diagram of a transmission side of a conventional optical transmission module.
Figure 15A:
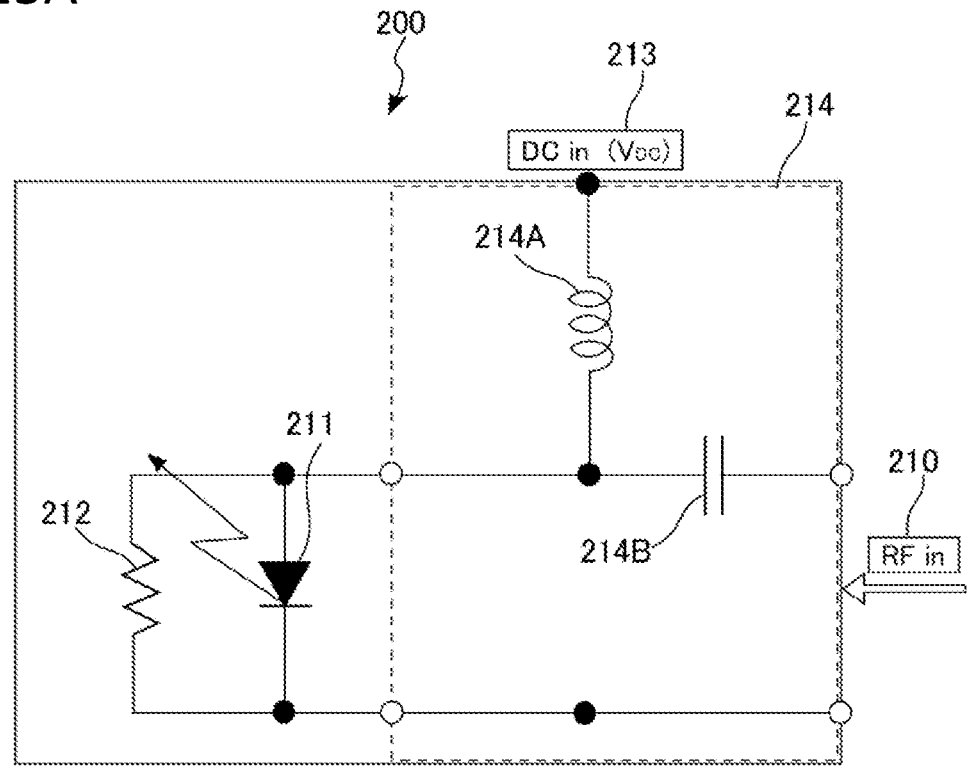
FIG. 15A is an equivalent circuit diagram of a bias circuit of a conventional optical transmission module, and is an equivalent circuit diagram of a circuit including a single matching resistor.
Figure 15B:
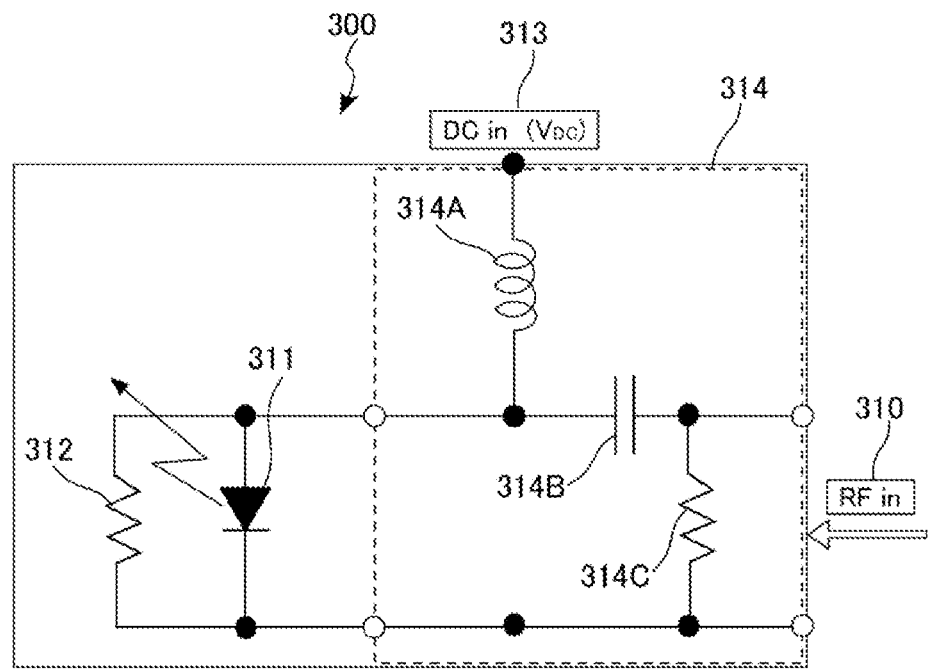
FIG. 15B is an equivalent circuit diagram of a bias circuit of a conventional optical transmission module, and is an equivalent circuit diagram of a circuit including two matching resistors.

FIG. 13 is a modification of the equivalent circuit diagram of the electrical-optical conversion circuit 6 according to the second embodiment. An electrical-optical conversion circuit 7 according to this modification has the same basic configuration as the electrical-optical conversion circuit 6. That is, a bias circuit of the electrical-optical conversion circuit 7 is composed of a power supply connection unit 71A and a bias-T circuit 71. The bias-T circuit 71 includes an inductor 71B that is connected in series between a DC supply connected to the power supply connection unit 71A and an electrical-optical conversion unit 72C and that prevents a high-frequency signal from flowing from a high-frequency signal input unit 72A to the power supply connection unit 71A, and a first capacitor 71C for preventing a large direct current from flowing into the high-frequency signal input unit 72A. A matching resistor 72B is connected in parallel to the electrical-optical conversion unit 72C between the high-frequency signal input unit 72A and the electrical-optical conversion unit 72C to match the characteristic impedance of the high-frequency signal circuit to that of the electrical-optical conversion unit 72C. The matching resistor 72B is connected in series to the inductor 71B and the first capacitor 71C, and thus prevents a direct current from flowing from the power supply connection unit 71A. Furthermore, the matching resistor 72B is connected in series to a second capacitor 72D between the high-frequency signal input unit 72A and the matching resistor 72B. Even when the high-frequency signal input unit 72A has a direct current, the second capacitor 72D prevents the direct current from flowing through the matching resistor 72B.

In this modification, a lead wire 71D for extracting a direct current is connected from the power supply connection unit 71A to a point between the high-frequency signal input unit 72A and the second capacitor 72D to superimpose a DC component on a high-frequency signal input from the high-frequency signal input unit 72A.

As in the first embodiment, it is possible to constitute an optical data link including an optical transmission module provided with the electrical-optical conversion circuit 6 or 7 according to the second embodiment, and an optical transmission system enabling transmission of an optical signal from a transmission-side device to a reception-side device via such an optical data link.

The technique of the present disclosure is not limited to the above embodiments. That is, the present disclosure encompasses the illustrated embodiments and variations by those skilled in the art based on those embodiments. The present disclosure encompasses replacement or combination of components or elements between one embodiment and other embodiments. Furthermore, the disclosed technical scope is not limited to the description of these embodiments. The disclosed technical scope is indicated by the recitation of the claims, and further includes all modifications within the meaning and scope equivalent to the recitation of the claims.

REFERENCE SIGNS LIST 1, 2 . . . Optical transmission module
4 . . . Optical data link
5 . . . Optical transmission system
11, 21 . . . First line
12, 22 . . . Second line
13, 23 . . . Coupling portion
14, 24 . . . High-frequency signal input unit
15, 25 . . . Termination unit
16, 26 . . . Power supply connection unit
17, 27 . . . Electrical-optical conversion unit
18, 28 . . . Bypass capacitor
35 . . . Microstrip antenna

What is claimed is:

1. An optical transmission module comprising:
a first line, one end of which is connected to a high-frequency signal input unit and the other end of which is connected to a termination unit;
a second line, one end of which is connected to an electrical-optical conversion unit that converts an electrical signal input from the high-frequency signal input unit into an optical signal and outputs the optical signal and the other end of which is connected to a power supply connection unit that is connected to a DC power supply and applies a voltage to drive the electrical-optical conversion unit; and
a coupling portion at which the first line and the second line are electromagnetically coupled to each other via a predetermined space with a predetermined electrical length with respect to a wavelength of a frequency used, wherein
in a frequency band range in which an attenuation of coupling characteristics between the first line and the second line is lower than an attenuation of isolation characteristics between the first line and the second line,
the electrical-optical conversion unit is connected to an end of the second line in the same direction as a propagation direction of a traveling wave of a high-frequency signal input from the high-frequency signal input unit to the first line, and the power supply connection unit is connected to the other end of the second line, and
in a frequency band range in which the attenuation of the coupling characteristics between the first line and the second line is higher than the attenuation of the isolation characteristics between the first line and the second line, the electrical-optical conversion unit is connected to an end of the second line in a direction opposite to a propagation direction of a traveling wave of a high-frequency signal input from the high-frequency signal input unit to the first line, and the power supply connection unit is connected to the other end of the second line.

2. The optical transmission module according to claim 1, wherein the first line and the second line are composed of a microstrip line.

3. The optical transmission module according to claim 2, wherein
the optical transmission module has a four-layer structure composed of a second dielectric substrate on which the second line is provided, a first dielectric substrate on which the first line is provided, and an intermediate dielectric substrate on which a microstrip antenna is provided and that is provided between the first dielectric substrate and the second dielectric substrate, and
the microstrip antenna is disposed at a termination position of the first line, and is resonantly coupled to the second line with the predetermined electrical length to form the coupling portion.

4. The optical transmission module according to claim 1, wherein the first line and the second line are composed of a coplanar line.

5. The optical transmission module according to claim 1, wherein
the optical transmission module is composed of a multilayer substrate in which a first dielectric substrate, a second dielectric substrate, and a third dielectric substrate are laminated,
the first line is provided on a first surface of the first dielectric substrate, and the high-frequency signal input unit and the termination unit connected to the first line are provided on a second surface of the first dielectric substrate opposite to the first surface of the first dielectric substrate,
the second line is provided on a first surface of the second dielectric substrate, and the power supply connection unit and the electrical-optical conversion unit connected to the second line are provided on a second surface of the second dielectric substrate opposite to the first surface of the second dielectric substrate, and
the third dielectric substrate is provided between the first surface of the first dielectric substrate and the first surface of the second dielectric substrate facing each other to form the coupling portion in a thickness direction of the third dielectric substrate.

6. The optical transmission module according to claim 5, wherein the electrical length is $\lambda/4$.

7. The optical transmission module according to claim 5, wherein a resistance of the termination unit is a characteristic impedance of the first line and the second line.

8. The optical transmission module according to claim 5, wherein a photodiode is connected as an optical-electrical conversion unit to the termination unit.

9. The optical transmission module according to claim 8, wherein the electrical-optical conversion unit is a vertical-cavity surface-emitting laser.

10. The optical transmission module according to claim 5, wherein the electrical-optical conversion unit is a vertical-cavity surface-emitting laser.

11. The optical transmission module according to claim 5, wherein a bypass capacitor is provided in a line connected to the power supply connection unit.

12. The optical transmission module according to claim 1, wherein the electrical length is $\lambda/4$.

13. The optical transmission module according to claim 1, wherein the termination unit is a characteristic impedance of the first line and the second line.

14. The optical transmission module according to claim 1, wherein a photodiode is connected as an optical-electrical conversion unit to the termination unit.

15. The optical transmission module according to claim 1, wherein the electrical-optical conversion unit is a vertical-cavity surface-emitting laser.

16. The optical transmission module according to claim 1, wherein a bypass capacitor is provided in a line connected to the power supply connection unit.

17. An optical transmission module comprising:
a high-frequency signal input unit;
an electrical-optical conversion unit that converts an electrical signal input from the high-frequency signal input unit into an optical signal and outputs the optical signal;
a matching resistor that is connected in parallel to the electrical-optical conversion unit between the high-frequency signal input unit and the electrical-optical conversion unit;
a power supply connection unit that is connected to a DC power supply and applies a voltage to drive the electrical-optical conversion unit;
an inductor that is connected in series between the power supply connection unit and the electrical-optical conversion unit and that prevents a high-frequency signal from flowing from the high-frequency signal input unit to the power supply connection unit;
a first capacitor that is connected in series between the matching resistor and the inductor and that prevents a direct current from flowing from the power supply connection unit to the matching resistor; and
a second capacitor that is connected in series between the high-frequency signal input unit and the matching resistor,
wherein a lead wire for extracting a direct current is connected from the power supply connection unit to a point between the high-frequency signal input unit and the second capacitor to superimpose a DC component on a high-frequency signal input from the high-frequency signal input unit.

18. An optical data link enabling bidirectional optical transmission, the optical data link comprising:
optical transmission modules; and
one or two optical cables, both ends of which are connected to the respective optical transmission modules, wherein
the optical transmission modules each include
a first line, one end of which is connected to a high-frequency signal input unit and the other end of which is connected to an optical-electrical conversion unit,
a second line, one end of which is connected to an electrical-optical conversion unit that converts an electrical signal input from the high-frequency signal input unit into an optical signal and outputs the optical signal and the other end of which is connected to a power supply connection unit that is connected to a DC power supply and applies a voltage to drive the electrical-optical conversion unit, and
a coupling portion at which the first line and the second line are electromagnetically coupled to each other via a predetermined space with a predetermined electrical length with respect to a wavelength of a frequency used,
in a frequency band range in which an attenuation of coupling characteristics between the first line and the second line is lower than an attenuation of isolation characteristics between the first line and the second line,
the electrical-optical conversion unit is connected to an end of the second line in the same direction as a propagation direction of a traveling wave of a high-frequency signal input from the high-frequency signal input unit to the first line, and the power supply connection unit is connected to the other end of the second line,
in a frequency band range in which the attenuation of the coupling characteristics between the first line and the second line is higher than the attenuation of the isolation characteristics between the first line and the second line,
the electrical-optical conversion unit is connected to an end of the second line in a direction opposite to a propagation direction of a traveling wave of a high-frequency signal input from the high-frequency signal input unit to the first line, and the power supply connection unit is connected to the other end of the second line, and the optical transmission modules connected to the respective ends of the one or two optical cables each include an E/O conversion processing unit from which an optical signal is output to the one or two optical cables, and an O/E conversion processing unit to which an optical signal is input from the one or two optical cables.

19. An optical transmission system enabling transmission of an optical signal from a transmission-side device to a reception-side device via the optical data link according to claim 18.

* * * * *